United States Patent
Villanueva et al.

(10) Patent No.: US 12,039,826 B2
(45) Date of Patent: Jul. 16, 2024

(54) THREE-DIMENSIONAL SCREEN FOR GAMING DEVICE

(71) Applicant: Aristocrat Technologies, Inc., Las Vegas, NV (US)

(72) Inventors: Samuel Villanueva, Las Vegas, NV (US); Garrett Hill, Las Vegas, NV (US)

(73) Assignee: Aristocrat Technologies, Inc., Las Vegas, NV (US)

( * ) Notice: Subject to any disclaimer, the term of this patent is extended or adjusted under 35 U.S.C. 154(b) by 308 days.

(21) Appl. No.: 17/490,916

(22) Filed: Sep. 30, 2021

(65) Prior Publication Data

US 2022/0301386 A1   Sep. 22, 2022

Related U.S. Application Data

(60) Provisional application No. 63/161,831, filed on Mar. 16, 2021.

(51) Int. Cl.
*G07F 17/32* (2006.01)
*F21V 8/00* (2006.01)
(Continued)

(52) U.S. Cl.
CPC .......... *G07F 17/3211* (2013.01); *G02B 6/001* (2013.01); *G06F 1/1654* (2013.01);
(Continued)

(58) Field of Classification Search
None
See application file for complete search history.

(56) References Cited

U.S. PATENT DOCUMENTS 4,915,641 A   4/1990 Miskin
5,653,638 A   8/1997 Nagata
(Continued)

FOREIGN PATENT DOCUMENTS

CN   203219363 U   9/2013
GB      2161969 B   3/1988
(Continued)

OTHER PUBLICATIONS

Office Action (Non-Final Rejection) dated May 9, 2023 for U.S. Appl. No. 17/490,954 (pp. 1-15).
(Continued)

*Primary Examiner* — Sunit Pandya
(74) *Attorney, Agent, or Firm* — Brownstein Hyatt Farber & Schreck, LLP

(57) ABSTRACT

A gaming device may comprise various components, including a main cabinet, a game controller, and a display assembly. The display assembly may be releasably coupled to the game cabinet so that the display assembly may be quickly removed prior to replacement and/or maintenance operations. The display assembly may include a display panel and a cover sheet positioned over the display panel. The cover sheet may be a glass cover sheet and may define a raised perimeter region that surrounds an interior portion of the cover sheet. A light pipe may be disposed below the raised perimeter region and may diffuse light emitted by the display panel and/or a backlight.

20 Claims, 15 Drawing Sheets

(51) Int. Cl.
*G06F 1/16* (2006.01)
*G06F 3/14* (2006.01)
*H05K 5/00* (2006.01)
*H05K 5/02* (2006.01)
*H05K 5/03* (2006.01)
*G06F 3/041* (2006.01)

(52) U.S. Cl.
CPC ........ *G06F 3/1446* (2013.01); *G07F 17/3209* (2013.01); *G07F 17/3216* (2013.01); *G07F 17/3218* (2013.01); *G07F 17/3223* (2013.01); *H05K 5/0017* (2013.01); *H05K 5/0221* (2013.01); *H05K 5/03* (2013.01); *G06F 3/041* (2013.01); *G07F 17/3267* (2013.01)

(56) References Cited

U.S. PATENT DOCUMENTS

| | | | |
|---|---|---|---|
| 5,940,153 | A | 8/1999 | Castaneda |
| 6,702,604 | B1 | 3/2004 | Moscovitch |
| 7,742,289 | B2 | 6/2010 | Quijano |
| 7,789,668 | B1 | 9/2010 | Hamner |
| 7,933,117 | B2 | 4/2011 | Howarth |
| 8,183,590 | B2 | 5/2012 | Suzuki |
| 8,810,479 | B2 | 8/2014 | Kim |
| 9,468,841 | B2 | 10/2016 | Stellenberg |
| 9,880,729 | B2 | 1/2018 | Rakshit |
| 9,945,509 | B2 | 4/2018 | Barnes |
| 10,210,699 | B2 | 2/2019 | Thompson |
| 10,476,181 | B2 | 11/2019 | Kaneko |
| 10,569,718 | B2 | 2/2020 | Barnes |
| 10,699,514 | B2 * | 6/2020 | Lapalme ............. G07F 17/3288 |
| 2004/0150581 | A1 | 8/2004 | Westerinen |
| 2005/0215325 | A1 | 9/2005 | Nguyen |
| 2006/0281558 | A1 | 12/2006 | Rifkin |
| 2007/0280593 | A1 | 12/2007 | Brychell |
| 2007/0287527 | A1 | 12/2007 | Tanabe |
| 2007/0298880 | A1 | 12/2007 | Rasmussen |
| 2008/0058051 | A1 | 3/2008 | Seelig |
| 2008/0062625 | A1 | 3/2008 | Batio |
| 2009/0275378 | A1 | 11/2009 | Anderson |
| 2010/0173704 | A1 | 7/2010 | Cole |
| 2010/0291992 | A1 | 11/2010 | Greenberg |
| 2011/0057965 | A1 | 3/2011 | Park |
| 2011/0070948 | A1 * | 3/2011 | Bainbridge ......... G07F 17/3218 463/30 |
| 2012/0037724 | A1 | 2/2012 | Prentice |
| 2012/0050200 | A1 * | 3/2012 | Vartanian ................ G06F 3/041 345/173 |
| 2012/0208645 | A1 | 8/2012 | Rodriguez |
| 2012/0268691 | A1 | 10/2012 | Kuo |
| 2012/0270648 | A1 * | 10/2012 | Rasmussen ......... G07F 17/3211 463/30 |
| 2012/0282997 | A1 | 11/2012 | Miner |
| 2014/0232617 | A1 | 8/2014 | Anite |
| 2016/0335835 | A1 | 11/2016 | Castro |
| 2016/0335836 | A1 | 11/2016 | Castro |
| 2017/0053478 | A1 | 2/2017 | Wudtke |
| 2017/0132870 | A1 | 5/2017 | Thompson |
| 2018/0101350 | A1 | 4/2018 | Nonaka |
| 2018/0157115 | A1 | 6/2018 | Hineno |
| 2019/0080554 | A1 | 3/2019 | Barbour |
| 2019/0096170 | A1 | 3/2019 | Lewis |
| 2019/0096174 | A1 | 3/2019 | Ambrecht |
| 2019/0102969 | A1 * | 4/2019 | Lapalme ............. G07F 17/3211 |
| 2019/0102975 | A1 | 4/2019 | Lapalme |
| 2019/0266835 | A1 * | 8/2019 | Ambrecht ........... G07F 17/3216 |
| 2020/0238170 | A1 | 7/2020 | Alsaid |
| 2021/0019986 | A1 * | 1/2021 | Urban .................... F21V 3/049 |
| 2021/0090383 | A1 | 3/2021 | Rodriguez |
| 2021/0205716 | A1 | 7/2021 | Shin |
| 2021/0209893 | A1 | 7/2021 | Rye |
| 2021/0322595 | A1 * | 10/2021 | Colvin ....................... A61L 9/20 |
| 2022/0092921 | A1 | 3/2022 | Barbour |
| 2022/0180695 | A1 | 6/2022 | Fritz |
| 2022/0301387 | A1 * | 9/2022 | Villanueva ............. G06F 3/1446 |
| 2022/0301391 | A1 * | 9/2022 | Villanueva ........... G07F 17/3218 |

FOREIGN PATENT DOCUMENTS

| | | |
|---|---|---|
| WO | 2006015046 A3 | 5/2007 |
| WO | 2018057380 A1 | 3/2018 |

OTHER PUBLICATIONS

Office Action (Final Rejection) dated Jan. 5, 2023 for U.S. Appl. No. 17/490,662 (pp. 1-24).
Office Action (Non-Final Rejection) dated Jun. 23, 2023 for U.S. Appl. No. 17/490,768 (pp. 1-8).
Office Action dated Jul. 21, 2022 for U.S. Appl. No. 17/490,662 (pp. 1-21).
Office Action (Non-Final Rejection) dated Aug. 29, 2023 for U.S. Appl. No. 17/490,768 (pp. 1-10).
Office Action (Notice of Allowance and Fees Due (PTOL-85)) dated Mar. 13, 2023 for U.S. Appl. No. 17/490,662 (pp. 1-8).
Office Action (Notice of Allowance and Fees Due (PTOL-85)) dated Oct. 20, 2023 for U.S. Appl. No. 17/490,954 (pp. 1-8).

* cited by examiner

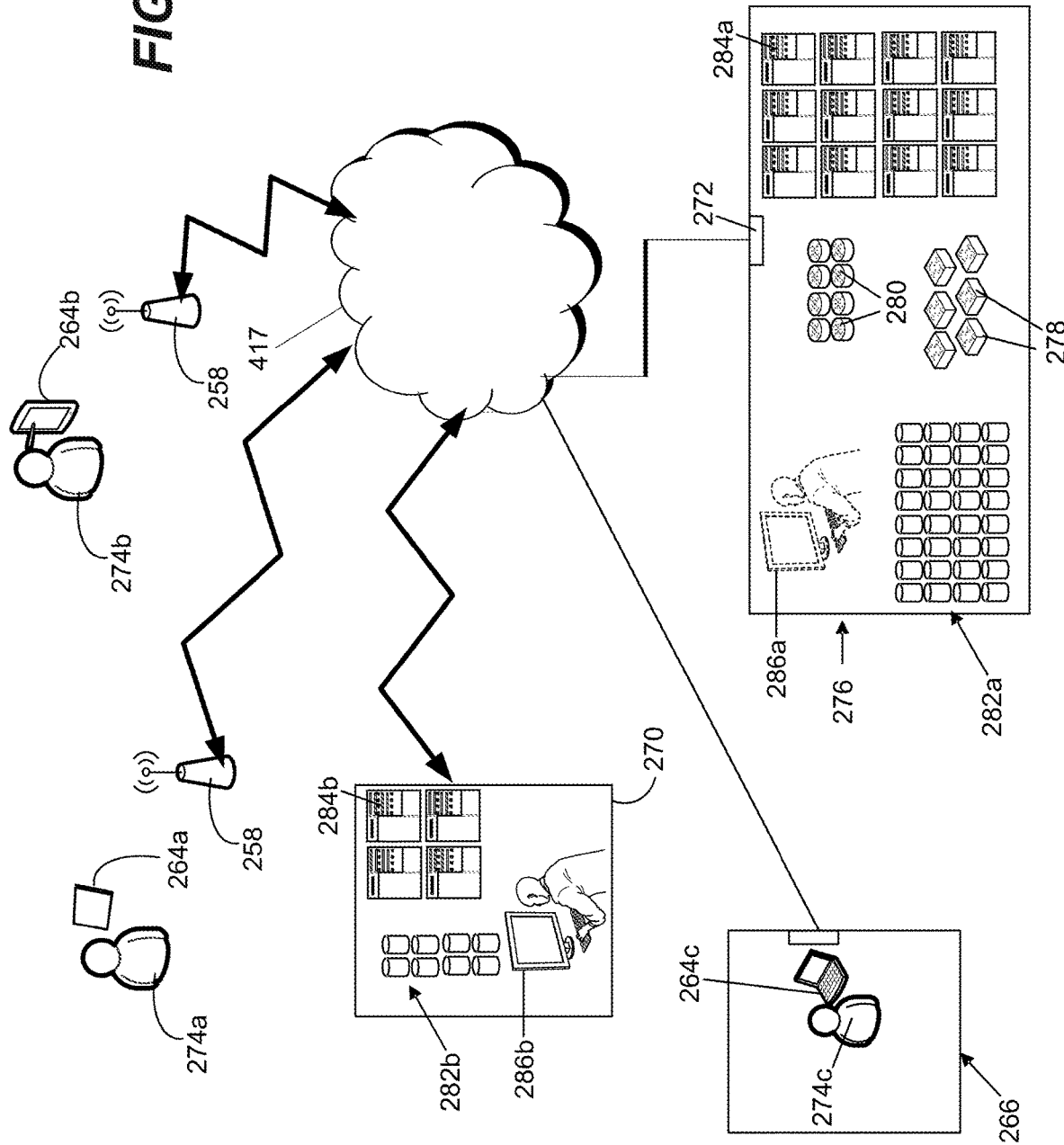

THREE-DIMENSIONAL SCREEN FOR GAMING DEVICE

CROSS-REFERENCE TO RELATED APPLICATION

This application is a nonprovisional of and claims the benefit under 35 U.S.C. 119(e) of U.S. Provisional Patent Application No. 63/161,831, filed Mar. 16, 2021, the contents of which are incorporated herein by reference as if fully disclosed herein.

FIELD

The present disclosure generally relates to electronic gaming machines and, more particularly, to a display for an electronic gaming machine.

BACKGROUND

Electronic gaming machines ("EGMs") or gaming devices may be used to provide a variety of wagering games such as slot games, video poker games, video blackjack games, roulette games, video bingo games, keno games, and other types of games that are frequently offered at casinos and other locations. Play on EGMs typically involves a player establishing a credit balance by inputting money, or another form of monetary credit, and placing a wager from the credit balance on one or more outcomes of an instance (or single play) of a primary or base game. In some cases, a player may qualify for a special mode of the base game, a secondary game, or a bonus round of the base game by attaining a certain winning combination or triggering event in, or related to, the base game, or after the player is randomly awarded the special mode, secondary game, or bonus round. In the special mode, secondary game, or bonus round, the player is given an opportunity to win extra game credits, game tokens, or other forms of payout. In the case of "game credits" that are awarded during play, the game credits are typically added to a credit meter total on the EGM and may be provided to the player upon completion of a gaming session or when the player wants to "cash out."

EGMs may include a display, or multiple displays, on which to display graphics or animations to a player. The display may present information concerning the particular wagering game being played. Information provided on the display may be controlled, or otherwise affected, by a player input. In this way, the player may control some aspect of the wagering game including, for example, interacting with graphical elements, making a wager, and so on. Displays may receive a user input (e.g., a touch input) and/or may be operatively coupled to other mechanisms for receiving a player input (e.g., a button or switch).

SUMMARY

This summary is provided to introduce a selection of concepts in simplified form that are further described below in the Detailed Description. This summary is not intended to identify key or essential features of the claimed subject matter nor is it intended to be used as an aid in determining the scope of the claimed subject matter.

Disclosed herein are gaming devices. The gaming devices may include a main cabinet, a game controller positioned within the main cabinet, and a display assembly coupled to the main cabinet.

In accordance with the provided disclosure, a gaming device may comprise a main cabinet, a game controller positioned in the main cabinet and configured to control a game provided at the gaming device, and a display assembly coupled to the main cabinet. The display assembly may comprise a display panel configured to provide graphical outputs corresponding to the game and a glass cover sheet extending over the display panel. The glass cover sheet may define an interior region disposed above the display panel and a raised perimeter region disposed above a perimeter region of the display panel and at least partially surrounding the interior region, the raised perimeter region being raised relative to the interior region.

In some implementations, the game controller may be configured to drive the perimeter region of the display panel separately from remaining portions of the display panel to selectively illuminate the raised perimeter region of the glass cover sheet.

The display assembly may further comprise a light pipe disposed underneath the raised perimeter region, the light pipe configured to diffuse light within the raised perimeter region, and a gasket positioned between the light pipe and the glass cover sheet. The display panel may define a first planar display region and a second planar display region offset from the first planar display region by an offset angle. The offset angle may be a first offset angle. The display assembly may further define a third planar display region offset from the first planar display region by a second offset angle. The first planar display region may be substantially perpendicular with respect to a mounting surface of the main cabinet.

In some cases, the display assembly may further comprise a base layer, a backlight positioned on the base layer, a light pipe positioned on the display panel, and a gasket positioned between the light pipe and the glass cover sheet. The graphical outputs provided by the display panel may comprise a first graphical output provided to the perimeter region of the display panel, the first graphical output underneath the raised perimeter region of the glass cover sheet, and a second graphical output provided to a remaining portion of the display panel, the second graphical output underneath the interior region of the glass cover sheet. The display assembly may further comprise a touch sensor configured to detect an input force applied to the glass cover sheet.

In accordance with the provided disclosure, a gaming device may comprise a housing, a display assembly comprising a display panel, a glass cover sheet extending over the display panel and defining a raised perimeter region surrounding the glass cover sheet, a display assembly housing at least partially surrounding the display panel, a light pipe disposed underneath the raised perimeter region, the light pipe configured to diffuse light within the raised perimeter region, and a gasket positioned between the light pipe and the glass cover sheet.

In some examples, the display panel may define a first planar display region, a second planar display region offset from the first planar display region by a first offset angle, and a third planar display region offset from the first planar display region by a second offset angle. Each of the first planar display region, the second planar display region, and the third planar display region may be at least partially defined by the raised perimeter region of the glass cover sheet.

A gaming device may additionally comprise a lock and a biasing element configured to provide a force to separate the display assembly from the housing when the lock is in an unlocked position. The raised perimeter region may increase a strength of the glass cover sheet.

In some implementations, the gaming device may further comprise a game controller positioned within the housing. The game controller may be configured to cause the display panel to produce a first graphical output corresponding to the raised perimeter region and cause the display panel to produce a second graphical output corresponding to an interior region. The first graphical output may correspond to edge lighting and the second graphical output may correspond to a game controlled by the game controller.

In accordance with the provided disclosure, a display assembly may be configured to be coupled with a main cabinet of a gaming device. The display assembly may comprise a display panel configured to provide graphical outputs, a cover sheet extending over the display panel and defining a raised perimeter region disposed above a perimeter region of the display panel, and a light pipe disposed underneath the raised perimeter region, the light pipe configured to diffuse light within the raised perimeter region.

In some examples, the display panel may define a first planar display region configured to provide a first graphical output and a second planar display region configured to provide a second graphical output, the second planar display region offset from the first planar display region by an offset angle. The cover sheet may be a glass cover sheet. The first graphical output may be separately controllable from the second graphical output. The display assembly may further comprise a gasket positioned between the light pipe and the cover sheet.

BRIEF DESCRIPTION OF THE DRAWINGS

Reference will now be made to representative examples illustrated in the accompanying figures. It should be understood that the following descriptions are not intended to limit the examples to one or more preferred examples. To the contrary, they are intended to cover alternatives, modifications, and equivalents as may be included within the spirit and scope of the described examples as defined by the appended claims. Similar reference numbers have been used, where possible, to designate similar features that are common between the figures.

FIG. 2C is a diagram that shows examples of components of a system for providing networked/online gaming according to some aspects of the present disclosure.

Figure 1:
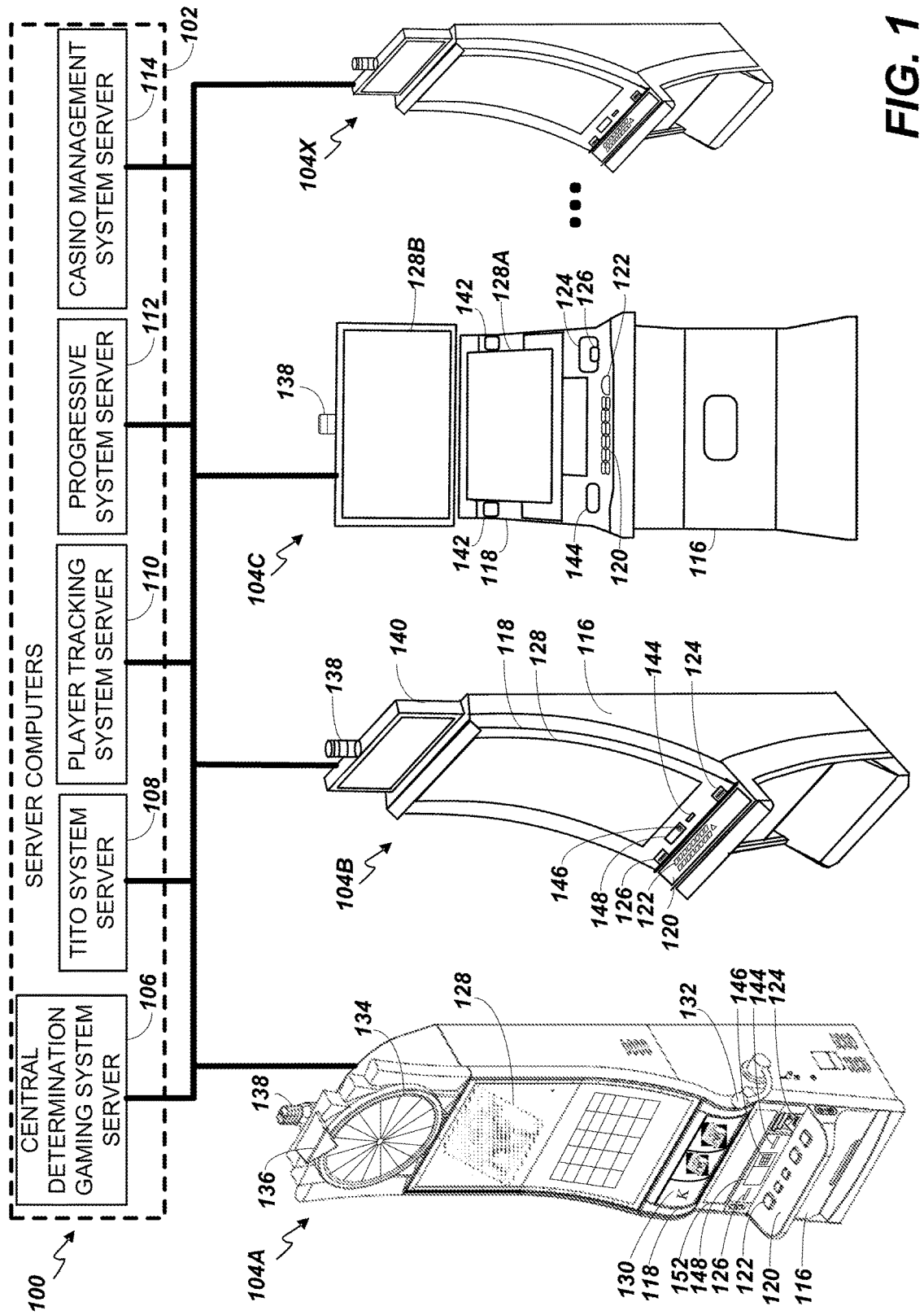
FIG. 1 is an exemplary diagram showing several electronic gaming machines (EGMs) networked with various gaming related servers.

The use of cross-hatching or shading in the accompanying figures is generally used to clarify the boundaries between adjacent elements and to facilitate legibility of the figures. Additionally, it should be understood that the proportions and dimensions (either relative or absolute) of the various figures and elements (and collections and groupings thereof), and the boundaries, separations, and positional relationships presented therebetween, are provided in the accompanying figures merely to facilitate an understanding of the various embodiments described herein, may not necessarily be presented or illustrated to scale, and are not intended to indicate any preference or requirement for an illustrated example to the exclusion of examples described with reference thereto.

DETAILED DESCRIPTION

The following disclosure generally includes various example implementations related to display assemblies and gaming devices, along with associated components. The display assemblies may include a display panel which may display content related to a game performed by the gaming device or associated components (e.g., a game controller). The display assemblies and associated gaming devices may optionally include quick connect mechanisms configured to attach or detach the display assemblies from the associated gaming devices. Additionally or alternatively, the display assemblies may include one or more components for sensing touch or force inputs on a display surface.

As discussed herein, a display assembly may include a display panel that includes a number of different planar display regions. Each planar display region may be presented at an offset angle with respect to neighboring planar display regions. Due to the planar display regions being presented at different offset angles, user interface elements displayed on a graphical user interface of each respective planar display region may be presented to a player of the gaming device at different angles (e.g., different viewing angles). For example, a first planar display region may be positioned so as to present information at an approximately 90° angle with respect to a neighboring planar display region. A transition between the first planar display region and the second planar display region may define a bent transition region and may be portrayed as a dark (e.g., black) region to visually distinguish neighboring planar display regions. The bent transition region may be depicted as a bright (e.g., white) region and/or may be depicted in any color/brightness to distinguish the bent transition region from neighboring planar display regions. Any number of "bends" or different planar display regions may be provided. In some examples, two planar display regions are provided at two different viewing positions and/or viewing angles to simulate a gaming device with two separate displays. In additional or alternate examples, three planar display regions are provided to simulate a gaming device with three separate displays, though the number of planar display regions is not limited to any particular number.

Each different planar display region may correspond to different graphical outputs of a game performed by the gaming device and/or game controller. In some examples, a bottom planar display region (e.g., a display region nearest the base of the gaming device) displays a user interface (UI) designed to display graphical elements and to receive a user input. For example, in a keno-type game, the bottom planar display region displays a keno card and permits a user selection thereof. In additional or alternative examples, the bottom planar display region displays a menu that includes a number of selectable options. Additionally or alternatively, the bottom planar display region is, or is a part of, a virtual button deck that includes multiple bet options.

In some implementations, a second planar display region is coupled to the bottom planar display region and is offset from the bottom planar display region by an offset angle. In such cases, the second planar display region displays graphics or animations showing certain functions of gameplay, as discussed herein. Continuing the above example of a keno-type game, the second planar display region displays drawing animations and/or representations of drawn markers. While particular examples are discussed with respect to a UI, these are merely explanatory and any UI may be used in accordance with the provided disclosure.

Incorporating multiple planar display regions at different angles to a player may have the benefit of reducing costs associated with multiple, discrete displays. For example, a gaming device with multiple displays has the benefit of providing an intuitive user experience, as each display displays different information or information categories at different viewing angles. However, multiple displays may be costly, may require complex wiring, or may be prone to multiple points of failure. A single display panel with multiple distinct display regions may provide the benefits of a multi-display gaming device without the added costs of multiple discrete displays.

Aspects of the provided disclosure further relate to integrated edge lighting for a display assembly. As discussed herein, edge lighting may refer to light surrounding the perimeter of a display panel, a planar display region, or a set of planar display regions. For example, an interior region of a display panel displays various UI elements that include game boards, graphics, and/or animations. Edge light may surround these UI elements and may be used to provide emphasis, through the use of light, to the perimeter and/or edge region of the display panel. In some cases, the edge lighting consists of a set number of pixels (e.g., 100 pixels) in a perimeter region of the display panel that at least partially surrounds the interior region. In additional or alternative cases, a light pipe or diffuser is provided over the perimeter region of the display panel to bend and/or blur the edge lighting.

In some examples, edge lighting incorporates radiating or emanating effects such as, for example, pixels which change color and/or brightness to simulate a movement or animation. Continuing the above example, the edge lighting is controlled by the same controller (e.g., a game controller) which controls the UI of an interior region of the display panel. In this way, visual emphasis may be brought to a game device which may attract a player's attention. Further, producing edge lighting using the display panel obviates the need for separate, dedicated edge-lighting hardware.

As described herein, the display assembly may include a glass cover sheet that extends over the display regions defined by the display panel. Various portions of the glass cover sheet may be raised or depressed compared to other portions. In some cases, a perimeter portion of the glass cover sheet, corresponding to the perimeter region of the display panel, is raised. The perimeter portion of the glass cover sheet may be raised so as to surround an interior region of the glass cover sheet. The raised perimeter portion may be rolled or may otherwise be extended to have a greater height than the interior region of the glass cover sheet. Since the perimeter portion of the glass cover sheet may be raised, there may be additional room for optical components underneath this portion of the glass cover sheet, and additional elements, such as a light pipe and/or diffuser, may be positioned underneath the perimeter portion. As discussed herein, the light pipe and/or diffuser may soften, bend, and/or blur light provided by the perimeter region of the display, as described above.

In some cases, a gasket (e.g., a rubber gasket) is provided between the glass cover sheet and the light pipe and/or diffuser to protect the edge of the glass cover sheet from impacts by, for example, players. In additional or alternative cases, the raised perimeter portion of the glass cover sheet increases a structural stability of the entire glass cover sheet. For example, in some cases a player may become frustrated and may strike or otherwise apply a force to the glass cover sheet. By increasing a thickness of the raised perimeter portion, a strength of the glass cover sheet may result. In this way, the raised perimeter portion may strengthen the glass cover sheet.

In some cases, a display assembly has features and elements designed for removal from a game cabinet of a gaming device. As provided herein, a gaming device may include both a display assembly and a game cabinet. The display assembly may include a display housing, a display, and other components associated with a display and/or functions of a gaming device. The game cabinet may include a game controller, a power supply, and/or other components of a gaming device/EGM as discussed herein. During the course of many successive operations on a gaming device, certain components may wear out or may otherwise need to be upgraded and/or replaced. In traditional systems with fully integrated displays and game cabinets, replacing specific components may be difficult and may require significant time and effort. This may lead to a loss in revenue, as a non-operational gaming device does not run any games and may waste valuable floor space.

The present disclosure considers embodiments where a display assembly and a game cabinet are modular and/or detachable. In some cases, a display assembly comprises an electrical connector and an attachment mechanism. The electrical connector may be a spring-based electrical system comprising two different components, with respective components positioned on the game cabinet and the display assembly. For example, the display assembly comprises an electrical connector comprised of a conductive material. The electrical connector may include a plunger, a barrel, and a spring. The spring may be coupled to the barrel and may move between a compressed state and an un-compressed state with respect to the barrel. The spring may impart a force on a counterpart electrical connector on, for example, the game cabinet when in an installed state. In this way, the electrical connector may impart a force to a receiving connector, establishing an electrical connection between the display assembly and the game cabinet. This arrangement may also reduce large amounts of internal wiring which may be difficult to repair and may introduce multiple points of failure.

Multiple parts of an attachment mechanism may additionally be provided on both of the display assembly and the game cabinet. For example, the display assembly comprises multiple paddles coupled to a rear portion thereof. When the display assembly is installed with the game cabinet, internal cables within the game cabinet may couple with the paddles on the display assembly, locking the game cabinet with the display assembly. The cables within the game cabinet may be loosened in response to an unlocking operation (e.g., unlocking a lock or squeezing a trigger) which may fully or partially decouple the display assembly from the game cabinet. In some cases, the cables causes a force to forcibly separate the display assembly from the game cabinet. The display assembly may additionally be provided with grips so that an operator may grasp the display assembly for removal or installation. In some cases, the grips are positioned in the same location as the paddle assemblies and are formed from a structure of the paddle assemblies. In this way, replacement of, for example, a malfunctioning display assembly (or any display assembly being replaced) may be made quickly and with minimal, or no, required tools.

As described herein, the provided disclosure generally provides solutions to one or more technical problems which may be present in traditional systems. For example, as described above, multiple displays have the benefit of providing a large amount of graphical information to a user. In some cases, the multiple displays provide respective graphical information at different viewing angles, so at to increase a user's immersion with an associated apparatus. However, multiple displays may increase the cost, complexity, assembly requirements, and/or maintenance requirements of a system. In some cases, each additional, discrete display requires the purchase of the additional display. Further, multiple, discrete displays may require more complex wiring, interconnections, and internal components to connect and/or harmonize the multiple displays. Yet further, the assembly and maintenance efforts associated with installing, replacing, and fixing multiple displays and components associated with the multiple displays may require a large amount of time and/or effort, due to the complexity of the interconnected systems, which may result in costly downtime of the apparatus.

To rectify these issues, and other associated issues, the present disclosure discusses a single display separated into multiple display regions and associated components. As a single display may be bought, installed, and/or maintained as a single unit, the benefits of providing multiple viewing angles to a user may be maintained while the drawbacks of multiple components, as described above, may be avoided. For example, a single display is quickly installed, contains integrated electrical components, and is otherwise treated as a single unit. Other associated features, such as integrating lighting into a display assembly and providing connect/disconnect structures, may further reduce cost and/or complexity of a game cabinet.

FIG. 1 illustrates several different models of EGMs which may be networked to various gaming related servers. Shown is a system 100 in a gaming environment that includes one or more server computers 102 (e.g., slot servers of a casino) that are in communication, via a communications network, with one or more gaming devices 104A-104X (EGMs, slots, video poker, bingo machines, etc.) that may implement one or more aspects of the present disclosure. The gaming devices 104A-104X may alternatively be portable and/or remote gaming devices such as, but not limited to, a smart phone, a tablet, a laptop, or a game console. Gaming devices 104A-104X may utilize specialized software and/or hardware to form non-generic, particular machines or apparatuses that comply with regulatory requirements regarding devices used for wagering or games of chance that provide monetary awards.

Communication between the gaming devices 104A-104X and the server computers 102, and among the gaming devices 104A-104X, may be direct or indirect using one or more communication protocols. As an example, gaming devices 104A-104X and the server computers 102 may communicate over one or more communication networks, such as over the Internet through a website maintained by a computer on a remote server or over an online data network including commercial online service providers, Internet service providers (ISPs), private networks (e.g., local area networks (LANs) and enterprise networks), and the like (e.g., wide area networks). The communication networks could allow gaming devices 104A-104X to communicate with one another and/or the server computers 102 using a variety of communication-based technologies, such as radio-frequency (RF) (e.g., wireless fidelity (WiFi®) and Bluetooth®), cable TV, satellite links, and so on.

In some implementations, server computers 102 may not be necessary and/or preferred. For example, in one or more implementations, a stand-alone gaming device such as gaming device 104A, gaming device 104B or any of the other gaming devices 104C-104X may implement one or more aspects of the present disclosure. However, it is typical to find multiple EGMs connected to networks implemented with one or more of the different server computers 102 described herein.

The server computers 102 may include a central determination gaming system server 106, a ticket-in-ticket-out (TITO) system server 108, a player tracking system server 110, a progressive system server 112, and/or a casino management system server 114. Gaming devices 104A-104X may include features to enable operation of any or all servers for use by the player and/or operator (e.g., the casino, resort, gaming establishment, tavern, pub, and so on). For example, game outcomes may be generated on a central determination gaming system server 106 and may then be transmitted over the network to any of a group of remote terminals or remote gaming devices 104A-104X that utilize the game outcomes and display the results to the players.

A gaming device 104A is often of a cabinet construction which may be aligned in rows or banks of similar devices for placement and operation on a casino floor. The gaming device 104A may include a main door which provides access to the interior of a main cabinet 116. The gaming device 104A may further include a button area or button deck 120 accessible by a player that is configured with input switches or buttons 122, an access channel for a bill validator 124, and/or an access channel for a ticket-out printer 126.

In FIG. 1, the gaming device 104A is shown as a Relm XL™ model gaming device manufactured by Aristocrat® Technologies, Inc. As shown, the gaming device 104A is a reel machine having a gaming display area 118 comprising a number (typically 3 or 5) of mechanical reels 130 with various symbols displayed on them. The mechanical reels 130 may be independently spun and stopped to show a set of symbols within the gaming display area 118 and may be used to determine an outcome to a game.

In many configurations, the gaming device 104A may have a main display 128 (e.g., a video display monitor) mounted to, or above, the gaming display area 118. The main display 128 may be a high-resolution liquid crystal display (LCD), plasma, light-emitting diode (LED), organic light emitting diode (OLED) panel, which may be flat or curved as shown, a cathode ray tube, or other conventional electronically controlled video monitor.

In some implementations, the bill validator 124 may also function as a "ticket-in" reader that allows the player to use a casino issued credit ticket to load credits onto the gaming device 104A (e.g., in a cashless ticket TITO system). In such cashless implementations, the gaming device 104A may also include a "ticket-out" printer 126 for outputting a credit ticket when a "cash out" button is pressed. Cashless TITO systems may be used to generate and track unique bar-codes or other indicators printed on tickets to allow players to avoid the use of bills and coins by loading credits using a ticket reader and cashing out credits using a ticket-out printer 126 on the gaming device 104A. The gaming device 104A may additionally have hardware meters for purposes including ensuring regulatory compliance and monitoring the player credit balance. In addition, there may be additional meters that record the total amount of money wagered on the gaming device, the total amount of money deposited, the total amount of money withdrawn, the total amount of winnings on gaming device 104A, and so on.

In some implementations, a player tracking card reader 144, a transceiver for wireless communication with a mobile device (e.g., a player's smartphone), a keypad 146, and/or an illuminated display 148 for reading, receiving, entering, and/or displaying player tracking information may be provided in gaming device 104A. In such implementations, a game controller within the gaming device 104A may communicate with the player tracking system server 110 to send and receive player tracking information.

Gaming device 104A may also include a bonus topper wheel 134. When bonus play is triggered (e.g., by a player achieving a particular outcome or set of outcomes in the primary game), the bonus topper wheel 134 may be operative to spin and stop with indicator arrow 136 indicating the outcome of the bonus game. The bonus topper wheel 134 may be used to play a bonus game, but could also be incorporated into play of the base or primary game.

A candle 138 may be mounted on the top of gaming device 104A and may be activated by a player (e.g., using a switch or one of buttons 122) to indicate to operations staff that gaming device 104A has experienced a malfunction or the player requires service. The candle 138 may also be used to indicate a jackpot has been won and to alert staff that a hand payout of an award may be needed.

There may also be one or more information panels 152 which may be a back-lit, silkscreened glass panel with lettering to indicate general game information including, for example, a game denomination (e.g., $0.25 or $1), pay lines, pay tables, and/or various game related graphics. In some implementations, the information panel(s) 152 may be implemented as an additional video display.

Gaming devices 104A may also include a handle 132 typically mounted to the side of main cabinet 116 which may be used to initiate gameplay.

Figure 2A:
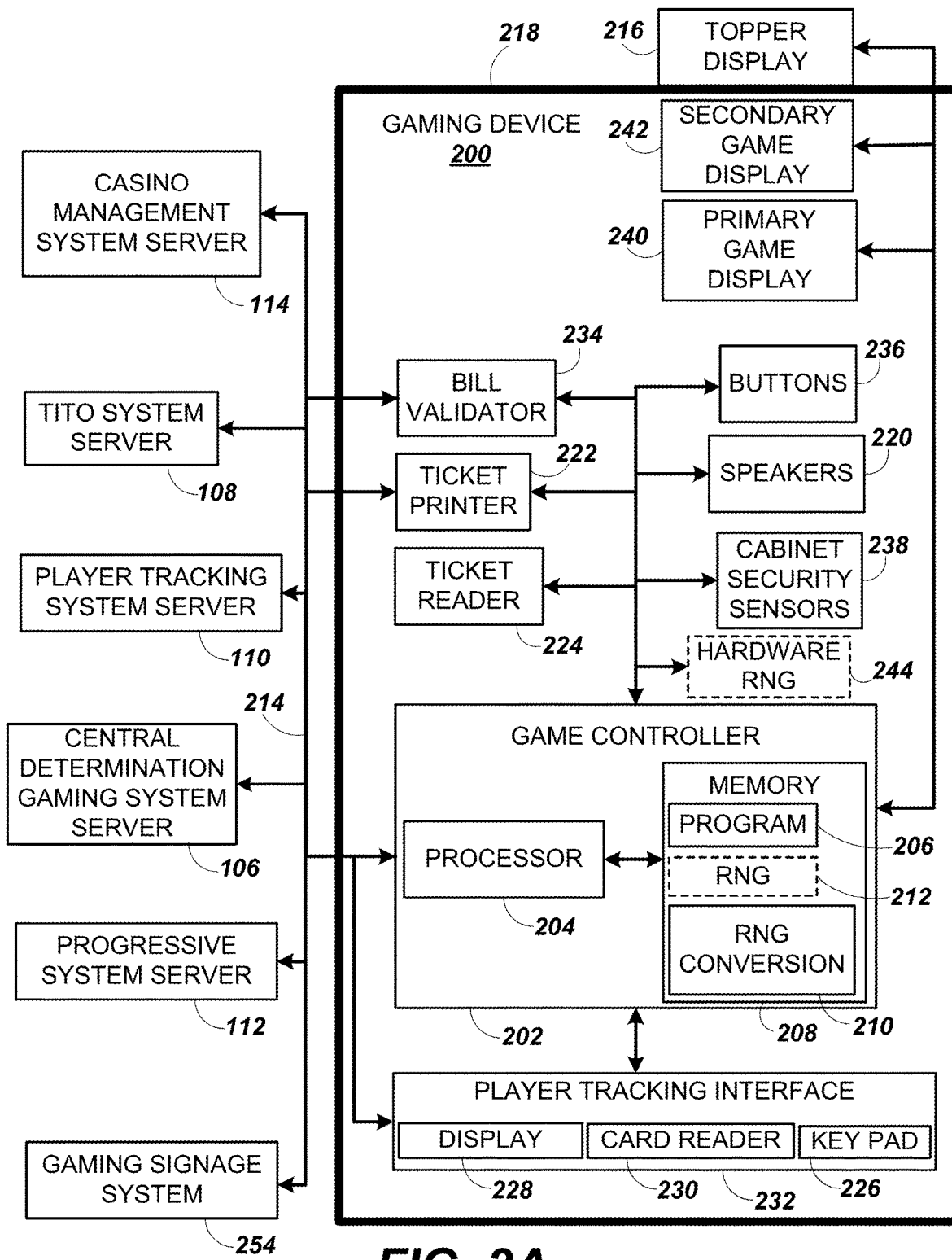
FIG. 2A is a block diagram showing various functional elements of an exemplary EGM.

Many or all the above described components may be controlled by circuitry (e.g., a game controller) housed inside the main cabinet 116 of the gaming device 104A, the details of which are shown in FIG. 2A.

An alternative example gaming device 104B illustrated in FIG. 1 is the Arc™ model gaming device manufactured by Aristocrat® Technologies, Inc. Note that, where possible, reference numerals identifying similar features of the gaming device 104A implementation are also identified in the gaming device 104B implementation using the same reference numbers. The gaming device 104B may not include physical reels and may instead show gameplay functions on a main display 128. An optional topper screen 140 may be used as a secondary game display for bonus play, to show game features or attraction activities while a game is not in play, or any other information or media desired by the game designer or operator. In some implementations, the optional topper screen 140 may also or alternatively be used to display progressive jackpot prizes available to a player during play of gaming device 104B.

Example gaming device 104B may include a main cabinet 116 including a main door which opens to provide access to the interior of the gaming device 104B. The main or service door may be used by service personnel to refill the ticket-out printer 126 and collect bills and tickets inserted into the bill validator 124. The main or service door may also be accessed to reset the machine, verify and/or upgrade the software, and for general maintenance operations.

Another example gaming device 104C shown is the Helix™ model gaming device manufactured by Aristocrat® Technologies, Inc. The gaming device 104C may include a main display 128A that is in a landscape orientation. Although not illustrated by the front view provided, the main display 128A may have a curvature radius from top to bottom, or alternatively from side to side. In some implementations, the main display 128A may be a flat panel display. The main display 128A may be used for primary gameplay while a secondary display 128B may be used for bonus gameplay, to show game features or attraction activities while the game is not in play, or any other information or media desired by the game designer or operator. In some implementations, the example gaming device 104C may also include speakers 142 to output various audio such as game sound, background music, etc.

Many different types of games, including mechanical slot games, video slot games, video poker, video black jack, video pachinko, keno, bingo, and lottery, may be provided with or implemented within the depicted gaming devices 104A-104C and other similar gaming devices. Each gaming device may also be operable to provide many different games. Games may be differentiated according to themes, sounds, graphics, type of game (e.g., slot game vs. card game vs. game with aspects of skill), denomination, number of paylines, maximum jackpot, progressive or non-progressive, bonus games, and so on, and may be deployed for operation in Class 2, Class 3, and so on. The gaming device 104X may represent any kind of gaming device and may include components similar to those in depicted gaming devices 104A-104C.

FIG. 2A is a block diagram depicting exemplary internal electronic components of a gaming device 200 connected to various external systems. All or parts of the gaming device 200 shown could be used to implement any one of the example gaming devices 104A-104X depicted in FIG. 1. As shown in FIG. 2A, the gaming device 200 includes a topper display 216 or another form of a top box (e.g., a topper wheel, a topper screen, and so on) that sits above a cabinet 218. The cabinet 218 or topper display 216 may also house a number of other components which may be used to add features to a game being played on gaming device 200, including speakers 220, a ticket printer 222 which prints bar-coded tickets or other media or mechanisms for storing or indicating a player's credit value, a ticket reader 224 which reads bar-coded tickets or other media or mechanisms for storing or indicating a player's credit value, and a player tracking interface 232. The player tracking interface 232 may include a keypad 226 for entering information, a player tracking display 228 for displaying information (e.g., an illuminated or video display), and a card reader 230 for receiving data and/or communicating information to and from media or a device such as a smart phone enabling player tracking. FIG. 2 also depicts utilizing a ticket printer 222 to print tickets for a TITO system server 108. The gaming device 200 may further include a bill validator 234, player-input buttons 236 for player input, cabinet security sensors 238 to detect unauthorized opening of the cabinet 218, a primary game display 240, and a secondary game display 242, each display coupled to and operable under the control of a game controller 202.

The games available for play on the gaming device 200 may be controlled by a game controller 202 that includes a processor 204. The processor 204 may represent a general-purpose processor, a specialized processor intended to perform certain functional tasks, a combination thereof, and so on. As an example, the processor 204 may be a central processing unit (CPU) that has one or more multi-core processing units and memory mediums (e.g., cache memory) that function as buffers and/or temporary storage for data. Alternatively, the processor 204 may be a specialized processor, such as an application specific integrated circuit (ASIC), graphics processing unit (GPU), field-programmable gate array (FPGA), digital signal processor (DSP), or another type of hardware accelerator. In another example, the processor 204 may be a system on chip (SoC) that combines and integrates one or more general-purpose processors and/or one or more specialized processors. Although FIG. 2A illustrates that the game controller 202 includes a single processor 204, the game controller 202 is not limited to this representation and may include multiple processors 204 (e.g., two or more processors).

FIG. 2A illustrates that the processor 204 is operatively coupled to a memory 208. The memory 208 is defined herein as including volatile and/or nonvolatile memory and other types of non-transitory data storage components. Volatile memory is memory that does not retain data values upon loss of power. Nonvolatile memory is memory that does retain data upon a loss of power. Examples of the memory 208 include random access memory (RAM), read-only memory (ROM), hard disk drives, solid-state drives, universal serial bus (USB) flash drives, memory cards accessed via a memory card reader, floppy disks accessed via an associated floppy disk drive, optical discs accessed via an optical disc drive, magnetic tapes accessed via an appropriate tape drive, and/or other memory components, a combination of any two or more of these memory components, and so on. In addition, examples of RAM include static random access memory (SRAM), dynamic random access memory (DRAM), magnetic random access memory (MRAM), and other devices. Examples of ROM include a programmable read-only memory (PROM), an erasable programmable read-only memory (EPROM), an electrically erasable programmable read-only memory (EEPROM), or other memory device. Even though FIG. 2A illustrates that the game controller 202 includes a single memory 208, game controller 202 could include multiple memories 208 for storing program instructions and/or data.

The memory 208 may store one or more game programs 206 that provide program instructions and/or data for carrying out various implementations (e.g., game mechanics) described herein. Stated another way, a game program 206 represents an executable program stored in any portion or component of the memory 208. In one or more implementations, the game program 206 is embodied in the form of source code that includes human-readable statements written in a programming language or machine code that contains numerical instructions recognizable by a suitable execution system, such as a processor 204 in a game controller 202 or other system. Examples of executable programs include: (1) a compiled program that may be translated into machine code in a format that may be loaded into a random access portion of a memory 208 and run by processor 204; (2) source code that may be expressed in proper format such as object code that is capable of being loaded into a random access portion of a memory 208 and executed by a processor 204; and (3) source code that may be interpreted by another executable program to generate instructions in a random access portion of a memory 208 to be executed by a processor 204.

Alternatively, a game program 206 may be set up to generate one or more game instances based on instructions and/or data that the gaming device 200 exchanges with one or more remote gaming devices, such as a central determination gaming system server 106 (not shown in FIG. 2A but depicted in FIG. 1). For purpose of this disclosure, the term "game instance" refers to a play or a round of a game that the gaming device 200 presents (e.g., via a user interface (UI)) to a player. The game instance may be communicated to the gaming device 200 via the network 214 and then displayed on gaming device 200. For example, the gaming device 200 may execute the game program 206 as video streaming software that allows the game to be displayed on the gaming device 200. When a game is stored on the gaming device 200, it may be loaded from the memory 208 (e.g., from a read only memory (ROM)) or from the central determination gaming system server 106 to the memory 208.

Gaming devices, such as the gaming device 200, are highly regulated to ensure fairness and, in some cases, the gaming device 200 is operable to award monetary awards (e.g., dispensed in the form of a redeemable voucher). Therefore, to satisfy security and regulatory requirements in a gaming environment, hardware and software architectures are implemented in the gaming device 200 that may differ from those of general-purpose computers. Adapting general purpose computers to function as gaming devices 200 may not be simple or straightforward because of: (1) the regulatory requirements for the gaming device 200, (2) the harsh environment in which the gaming device 200 operate, (3) security requirements, (4) fault tolerance requirements, and (5) the requirement for additional special purpose componentry enabling functionality of an EGM. These differences require substantial engineering effort with respect to game design implementation, game mechanics, hardware components, and software.

One regulatory requirement for games running on the gaming device 200 generally involves complying with a certain level of randomness. Gaming jurisdictions may mandate that gaming devices satisfy a minimum level of randomness without specifying how a gaming device should achieve this level of randomness. To comply, FIG. 2A illustrates that the gaming device 200 may include a random number generator (RNG) 212 that utilizes hardware and/or software to generate RNG outcomes that lack any pattern. The RNG operations may be specialized and non-generic in order to comply with regulatory and gaming requirements. For example, in a slot game, the game program 206 may initiate multiple RNG calls to RNG 212 to generate RNG outcomes, where each RNG call and RNG outcome corresponds to an outcome for a reel. In another example, the gaming device 200 may be a Class 2 gaming device where the RNG 212 generates RNG outcomes for creating bingo cards. In one or more implementations, the RNG 212 could be one of a set of RNGs operating on the gaming device 200. More generally, an output of the RNG 212 may be the basis on which game outcomes are determined by the game controller 202. Game developers could vary the degree of true randomness for each RNG (e.g., pseudorandom) and utilize specific RNGs depending on game requirements. The output of the RNG 212 may include a random number or pseudorandom number (either is generally referred to as a "random number").

In FIG. 2A, the RNG 212 and a hardware RNG 244 are shown in dashed lines to illustrate that the RNG 212, the hardware RNG 244, or both, may be included in the gaming device 200. In some implementations, instead of including the RNG 212, the gaming device 200 may include a hardware RNG 244 that generates RNG outcomes. Analogous to the RNG 212, the hardware RNG 244 may perform specialized and non-generic operations in order to comply with regulatory and gaming requirements. For example, because of regulation requirements, the hardware RNG 244 may be a random number generator that securely produces random numbers for cryptography use. The gaming device 200 may then use the secure random numbers to generate game outcomes for one or more game features. In additional or alternative implementations, the gaming device 200 may include both the hardware RNG 244 and the RNG 212. The RNG 212 may additionally or alternatively utilize the RNG outcomes from the hardware RNG 244 as one of many sources of entropy for generating secure random numbers for the game features.

Another regulatory requirement for running games on the gaming device 200 includes ensuring a certain level of Return to Player (RTP) payouts. Similar to the randomness requirement discussed above, numerous gaming jurisdictions may also mandate that a gaming device provides a minimum level of RTP (e.g., RTP of at least 75%). A game may use one or more lookup tables (also called weighted tables) as part of a technical solution that satisfies regulatory requirements for randomness and RTP. In particular, a lookup table may integrate game features (e.g., trigger events for special modes or bonus games; newly introduced game elements such as extra reels, new symbols, or new cards; stop positions for dynamic game elements such as spinning reels, spinning wheels, or shifting reels; or card selections from a deck) with random numbers generated by one or more RNGs, so as to achieve a given level of volatility for a target level of RTP. (In general, volatility refers to the frequency or probability of an event such as a special mode, payout, etc. For example, for a target level of RTP, a higher-volatility game may have a lower payout most of the time with an occasional bonus having a very high payout, while a lower-volatility game has a steadier payout with more frequent bonuses of smaller amounts.) Configuring a lookup table may involve engineering decisions with respect to how RNG outcomes are mapped to game outcomes for a given game feature, while still satisfying regulatory requirements for RTP. Configuring a lookup table may also involve engineering decisions about whether different game features are combined in a given entry of the lookup table or split between different entries (for the respective game features), while still satisfying regulatory requirements for RTP and allowing for varying levels of game volatility.

FIG. 2A illustrates that the gaming device 200 includes a RNG conversion engine 210 that translates the RNG outcome from the RNG 212 to a game outcome presented to a player. To meet a designated RTP, a game developer may set up the RNG conversion engine 210 to utilize one or more lookup tables to translate the RNG outcome to a symbol element, stop position on a reel strip layout, and/or randomly chosen aspect of a game feature. As an example, the lookup tables may regulate a prize payout amount for each RNG outcome and how often the gaming device 200 pays out the prize payout amounts. The RNG conversion engine 210 may utilize one lookup table to map the RNG outcome to a game outcome displayed to a player and a second lookup table as a pay table for determining the prize payout amount for each game outcome. The mapping between the RNG outcome to the game outcome may partially or entirely control the frequency in hitting certain prize payout amounts.

FIG. 2A also depicts that the gaming device 200 is connected over network 214 to a player tracking system server 110. The player tracking system server 110 may be, for example, an OASIS® system manufactured by Aristocrat® Technologies, Inc. The player tracking system server 110 may be used to track play (e.g. amount wagered, games played, time of play and/or other quantitative or qualitative measures) for individual players so that an operator may reward players in a loyalty program. The player may use the player tracking interface 232 to access his/her account information, activate free play, and/or request various information. Player tracking or loyalty programs may reward players for their play and may help build brand loyalty to the gaming establishment. The rewards typically correspond to the player's level of patronage (e.g., to the player's playing frequency and/or total amount of gameplays at a given casino). Player tracking rewards may be complimentary and/or discounted meals, lodging, entertainment and/or additional play. Player tracking information may be combined with other information that may be readily obtainable by a casino management system.

When a player wishes to play the gaming device 200, he/she may insert cash or a ticket voucher through a coin acceptor (not shown) or bill validator 234 to establish a credit balance on the gaming device. The credit balance may be used by the player to place wagers on instances of the game and to receive credit awards based on the outcome of winning instances. The credit balance may be decreased by the amount of each wager and may be increased upon a win. The player may add additional credits to the balance at any time. The player may also optionally insert a loyalty club card into the card reader 230. During the game, the player may view, with one or more user interfaces (UIs), the game outcome on one or more of the primary game display 240 and secondary game display 242. Other game and prize information may also be displayed.

For each game instance, a player may make selections, which may affect play of the game. For example, the player may vary the total amount wagered by selecting the amount bet per line and the number of lines played. In some games, the player may be asked to initiate or select options during course of gameplay (such as spinning a wheel to begin a bonus round or select various items during a feature game). The player may make these selections using the player-input buttons 236, the primary game display 240 which may be a touch screen, or using another device which enables a player to input information into the gaming device 200.

During certain game events, the gaming device 200 may display visual and auditory effects that may be perceived by the player. These effects may add to the excitement of a game, which may make a player more likely to enjoy the playing experience. Auditory effects include various sounds that are projected by the speakers 220. Visual effects include flashing lights, strobing lights or other patterns displayed from lights on the gaming device 200 or from lights behind the information panel 152 (see FIG. 1).

When the player is done, he/she may cash out the credit balance (typically by pressing a cash out button to receive a ticket from the ticket printer 222). The ticket may be "cashed-in" for money or inserted into another machine to establish a credit balance for play.

Additionally, or alternatively, gaming devices 104A-104X and 200 may include or be coupled to one or more wireless transmitters, receivers, and/or transceivers (not shown in FIGS. 1 and 2A) that communicate (e.g., Bluetooth® or other near-field communication technology) with one or more mobile devices to perform a variety of wireless operations in a casino environment. Examples of wireless operations in a casino environment may include detecting the presence of mobile devices; performing credit, points, comps, or other marketing or hard currency transfers; establishing wagering sessions; providing a personalized casino-based experience using a mobile application; and so on. In some implementations, to perform these wireless operations, a wireless transmitter or transceiver may initiate a secure wireless connection between a gaming devices 104A-104X and/or 200 and a mobile device. After establishing a secure wireless connection between the gaming devices 104A-104X and/or 200 and the mobile device, the wireless transmitter or transceiver may not send and/or receive application data to and/or from the mobile device. Rather, the mobile device communicates with gaming devices 104A-104X and/or 200 may use another wireless connection (e.g., WiFi® or cellular network). In alternative or additional implementations, a wireless transceiver may establish a secure connection to directly communicate with the mobile device. The mobile device and gaming device 104A-104X and/or 200 may send and receive data utilizing the wireless transceiver instead of utilizing an external network. For example, the mobile device may perform digital wallet transactions by directly communicating with the wireless transceiver. In some implementations, a wireless transmitter could broadcast data received by one or more mobile devices without establishing a pairing connection with the mobile devices.

Although FIGS. 1 and 2A illustrate specific implementations of a gaming device (e.g., gaming devices 104A-104X and/or 200), the disclosure is not limited to those implementations shown in FIGS. 1 and 2. For example, not all gaming devices suitable for implementing implementations of the present disclosure necessarily include top wheels, top boxes, information panels, cashless ticket systems, and/or player tracking systems. Further, some suitable gaming devices may only have a single game display that includes only a mechanical set of reels and/or a video display, while others may be designed for bar counters or tabletops and have displays that face upwards. Gaming devices 104A-104X and 200 may also include other processors that are not separately shown. Using FIG. 2A as an example, a gaming device 200 may include display controllers (such as a game pad, keyboard, or button-based input, not shown in FIG. 2A) configured to receive video input signals or instructions to display images on game displays 240 and 242. Alternatively, such display controllers may be integrated into the game controller 202. The use and discussion of FIGS. 1 and 2 are examples to facilitate ease of description and explanation.

Figure 2B:
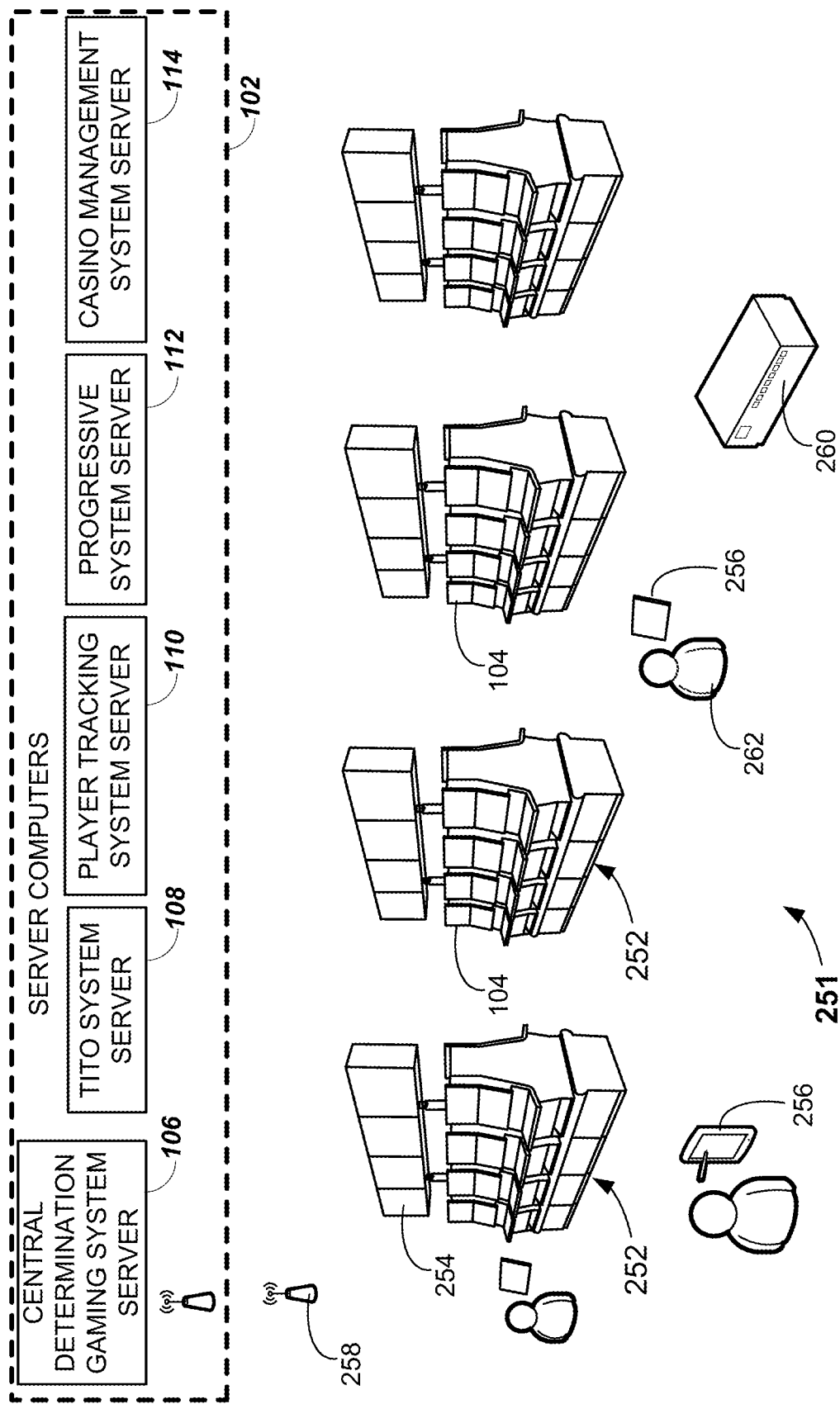
FIG. 2B depicts a casino gaming environment according to some examples.

FIG. 2B depicts a casino gaming environment according to one example. In this example, the casino 251 may include banks 252 of EGMs 104. In this example, each bank 252 of EGMs 104 may include a corresponding gaming signage system 254 (also shown in FIG. 2A). According to this implementation, the casino 251 may also include mobile gaming devices 256, which are also configured to present wagering games in this example. The mobile gaming devices 256 may, for example, include tablet devices, cellular phones, smart phones and/or other handheld devices. In this example, the mobile gaming devices 256 may be configured for communication with one or more other devices in the casino 251, including but not limited to one or more of the server computers 102, via wireless access points 258.

According to some examples, the mobile gaming devices 256 may be configured for stand-alone determination of game outcomes. However in additional or alternative implementations, the mobile gaming devices 256 may be configured to receive game outcomes from another device, such as the central determination gaming system server 106, one of the EGMs 104, and so on.

Some mobile gaming devices 256 may be configured to accept monetary credits from a credit or debit card, via a wireless interface (e.g., via a wireless payment app), tickets, a patron casino account, and so on. However, some mobile gaming devices 256 may not be configured to accept monetary credits via a credit or debit card. Some mobile gaming devices 256 may include a ticket reader and/or a ticket printer whereas some mobile gaming devices 256 may not, depending on the particular implementation.

In some implementations, the casino 251 may include one or more kiosks 260 that are configured to facilitate monetary transactions involving the mobile gaming devices 256, which may include cash-out and/or cash-in transactions. The kiosks 260 may be configured for wired and/or wireless communication with the mobile gaming devices 256. The kiosks 260 may be configured to accept monetary credits from casino patrons 262 and/or to dispense monetary credits to casino patrons 262 via cash, a credit or debit card, a wireless interface (e.g., a wireless payment app), tickets, and so on. According to some examples, the kiosks 260 may be configured to accept monetary credits from a casino patron and may provide a corresponding amount of monetary credits to a mobile gaming device 256 for wagering purposes, e.g., via a wireless link such as a near-field communications link. In some such examples, when a casino patron 262 is ready to cash out, the casino patron 262 may select a cash out option provided by a mobile gaming device 256, which may include a real button or a virtual button (e.g., a button provided via a graphical user interface) in some instances. In some such examples, the mobile gaming device 256 may send a "cash out" signal to a kiosk 260 via a wireless link in response to receiving a "cash out" indication from a casino patron. The kiosk 260 may provide monetary credits to the casino patron 262 corresponding to the "cash out" signal, which may be in the form of cash, a credit ticket, a credit transmitted to a financial account corresponding to the casino patron, and so on.

In some implementations, a cash-in process and/or a cash-out process may be facilitated by the TITO system server 108. For example, the TITO system server 108 may control, or at least authorize, ticket-in and ticket-out transactions that involve a mobile gaming device 256 and/or a kiosk 260.

Some mobile gaming devices 256 may be configured for receiving and/or transmitting player loyalty information. For example, some mobile gaming devices 256 may be configured for wireless communication with the player tracking system server 110. Some mobile gaming devices 256 may be configured for receiving and/or transmitting player loyalty information via wireless communication with a patron's player loyalty card, a patron's smartphone, etc.

According to some implementations, a mobile gaming device 256 may be configured to provide safeguards that prevent the mobile gaming device 256 from being used by an unauthorized person. For example, some mobile gaming devices 256 may include one or more biometric sensors and may be configured to receive input via the biometric sensor(s) to verify the identity of an authorized patron. Some mobile gaming devices 256 may be configured to function only within a predetermined or configurable area, such as a casino gaming area.

FIG. 2C is a diagram that shows examples of components of a system for providing online gaming according to some aspects of the present disclosure. As with other figures presented in this disclosure, the numbers, types and arrangements of gaming devices shown in FIG. 2C are merely shown by way of example. In this example, various gaming devices, including but not limited to end user devices (EUDs) 264a, 264b and 264c may be capable of communication via one or more networks 417. The networks 417 may, for example, include one or more cellular telephone networks, the Internet, and so on. In this example, the EUDs 264a and 264b are mobile devices: where the EUD 264a is a tablet device and the EUD 264b is a smart phone. In this implementation, the EUD 264c is a laptop computer that is located within a residence 266 at the time depicted in FIG. 2C. Accordingly, in this example the hardware of EUDs is not specifically configured for online gaming, although each EUD is configured with software for online gaming. For example, each EUD may be configured with a web browser. Other implementations may include other types of EUD, some of which may be specifically configured for online gaming.

In this example, a gaming data center 276 may include various devices that are configured to provide online wagering games via the networks 417. The gaming data center 276 may be capable of communication with the networks 417 via the gateway 272. In this example, switches 278 and routers 280 may be configured to provide network connectivity for devices of the gaming data center 276, including storage devices 282a, servers 284a, and one or more workstations 286a. The servers 284a may, for example, be configured to provide access to a library of games for online gameplay. In some examples, code for executing at least some of the games may initially be stored on one or more of the storage devices 282a. The code may be subsequently loaded onto a server 284a after selection by a player via an EUD and communication of that selection from the EUD via the networks 417. The server 284a onto which code for the selected game has been loaded may provide the game according to selections made by a player and indicated via the player's EUD. In other examples, code for executing at least some of the games may initially be stored on one or more of the servers 284a. Although only one gaming data center 276 is shown in FIG. 2C, some implementations may include multiple gaming data centers 276.

In this example, a financial institution data center 270 is also configured for communication via the networks 417. Here, the financial institution data center 270 may include servers 284b, storage devices 282b, and one or more workstations 286b. According to this example, the financial institution data center 270 may be configured to maintain financial accounts, such as checking accounts, savings accounts, loan accounts, and so on. In some implementations, one or more of the authorized users 274a-274c may maintain at least one financial account with the financial institution that is serviced via the financial institution data center 270.

According to some implementations, the gaming data center 276 may be configured to provide online wagering games in which money may be won or lost. According to some such implementations, one or more of the servers 284a may be configured to monitor player credit balances, which may be expressed in game credits, in currency units, or in any other appropriate manner. In some implementations, the server(s) 284a may be configured to obtain financial credits from and/or provide financial credits to one or more financial institutions, according to a player's "cash in" selections, wagering game results, and a player's "cash out" instructions. According to some such implementations, the server(s) 284a may be configured to electronically credit or debit the account of a player that is maintained by a financial institution, e.g., an account that is maintained via the financial institution data center 270. The server(s) 284a may, in some examples, be configured to maintain an audit record of such transactions.

In some alternative implementations, the gaming data center 276 may be configured to provide online wagering games for which credits may not be exchanged for cash or the equivalent. In some such examples, players may purchase game credits for online gameplay, but may not "cash out" for monetary credit after a gaming session. Moreover, although the financial institution data center 270 and the gaming data center 276 include their own servers and storage devices in this example, in some examples the financial institution data center 270 and/or the gaming data center 276 may use offsite "cloud-based" servers and/or storage devices. In some alternative examples, the financial institution data center 270 and/or the gaming data center 276 may rely entirely on cloud-based servers.

One or more types of devices in the gaming data center 276 (or elsewhere) may be capable of executing middleware, e.g., for data management and/or device communication. Authentication information, player tracking information, etc., including but not limited to information obtained by EUDs 264 and/or other information regarding authorized users of EUDs 264 (including but not limited to the authorized users 274a-274c), may be stored on storage devices 282 and/or servers 284. Other game-related information and/or software, such as information and/or software relating to leaderboards, players currently playing a game, game themes, game-related promotions, game competitions, etc., also may be stored on storage devices 282 and/or servers 284. In some implementations, some such game-related software may be available as applications ("apps") and may be downloadable (e.g., from the gaming data center 276) by authorized users.

In some examples, authorized users and/or entities (such as representatives of gaming regulatory authorities) may obtain gaming-related information via the gaming data center 276. One or more other devices (such EUDs 264 or devices of the gaming data center 276) may act as intermediaries for such data feeds. Such devices may, for example, be capable of applying data filtering algorithms, executing data summary and/or analysis software, etc. In some implementations, data filtering, summary and/or analysis software may be available as "apps" and downloadable by authorized users.

Figure 3A:
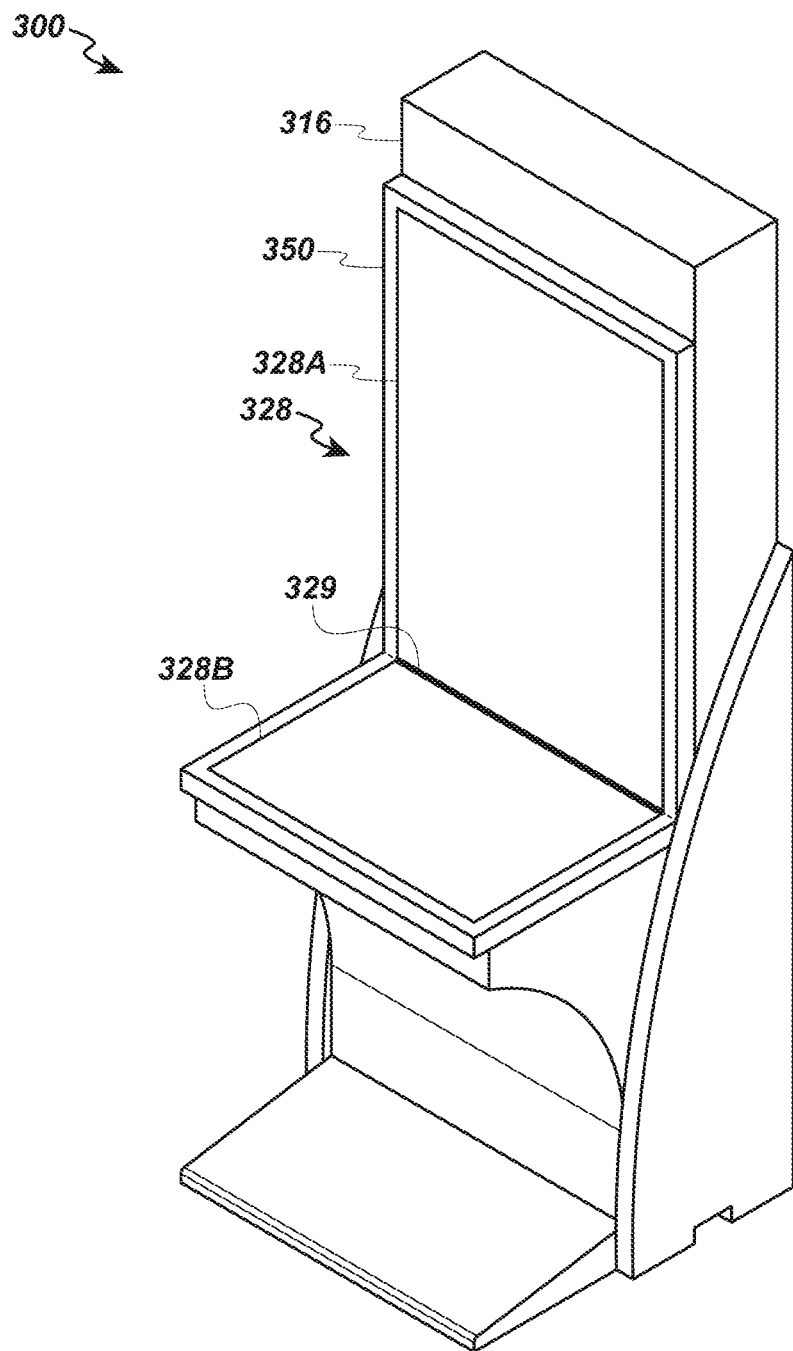
FIGS. 3A and 3B depict an example gaming device that includes a display panel with two planar display regions.
Figure 3B:
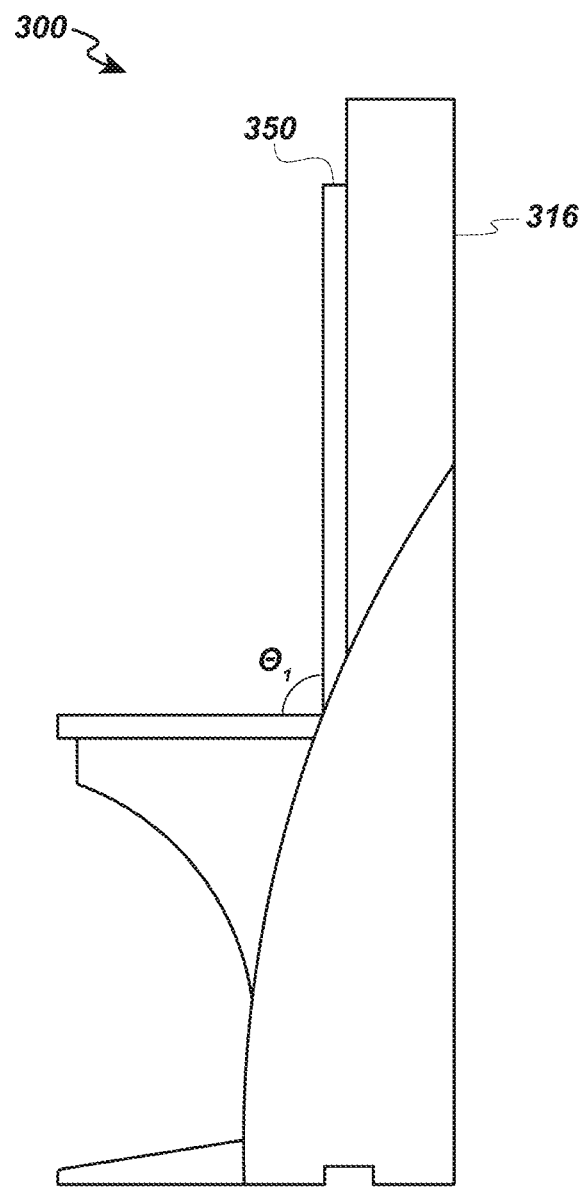

FIGS. 3A and 3B illustrate an example gaming device 300 (e.g., an EGM) that includes a display panel 328 with two planar display regions, a first planar display region 328A and a second planar display region 328B. As discussed and shown with respect to FIG. 3B, each of the planar display regions may be offset by an offset angle $\theta_1$ and may be presented differently (e.g., at different viewing angles) to a player of the gaming device 300. Due to the offset angle $\theta_1$ between the first planar display region 328A and the second planar display region 328B, the two planar display regions may simulate multiple, discrete displays.

In the provided figures, the offset angle $\theta_1$ is set to 90°, though in other cases the offset angle $\theta_1$ may be set to any other value. It is additionally noted that the offset angle $\theta_1$ is formed as a right angle (e.g., with a hard edge) as it appears in FIGS. 3A and 3B. However, in some cases, the offset angle $\theta_1$ is smoothed, rounded or otherwise softened so that a transition between the first planar display region 328A and the second planar display region 328B is made more gradual.

The gaming device 300 may be similar to the gaming devices discussed herein (e.g., gaming devices 104A-104X) and the visual appearance of the gaming device 300 is not limited to that depicted in FIG. 3A. The gaming device 300 may include a main cabinet 316 and a display assembly 350. In some cases, the main cabinet 316 may be detachably coupled with the display assembly 350.

The main cabinet 316 may act as a main housing and may include a main door, and/or a main access panel, which provides access to the interior of the main cabinet 316. The interior of the main cabinet 316 may include various electronic components such as, for example, machinery/materials for printing/accepting tickets, components for scanning tickets and/or cards, a game controller, a power supply, and so on (see, e.g., discussion surrounding FIG. 1). The main cabinet 316 may be detachably coupled with a display assembly 350, such as described with respect to FIGS. 9A-9B. That is, the main cabinet 316 may be provided on a floor (e.g., a casino floor) and the display assembly 350 may be removed after being released from the main cabinet 316. In some cases, the display assembly 350 is integrated with the main cabinet 316 such that the display assembly 350 is not removable from the main cabinet 316.

Figure 9A:
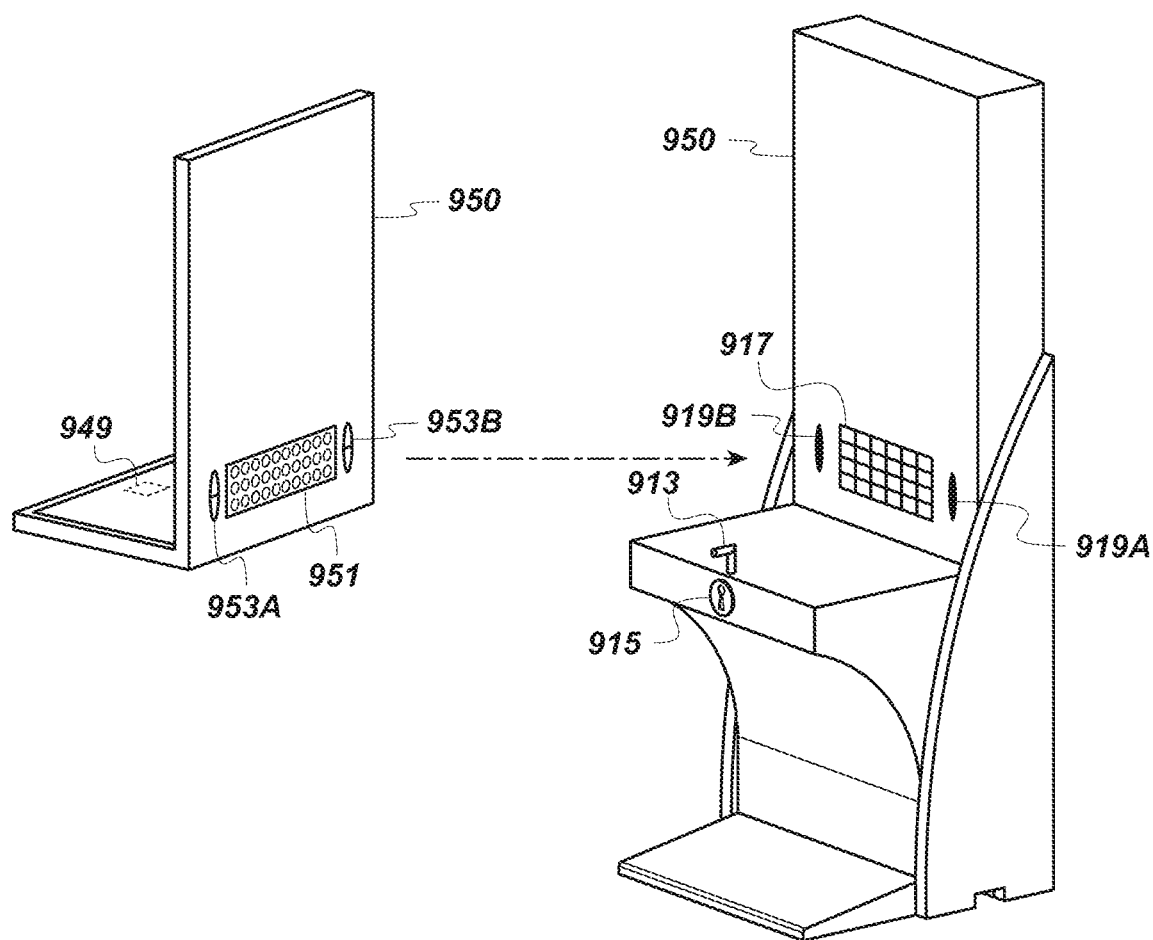
FIG. 9A depicts an example display assembly and an example main cabinet in a detached state.
Figure 9B:
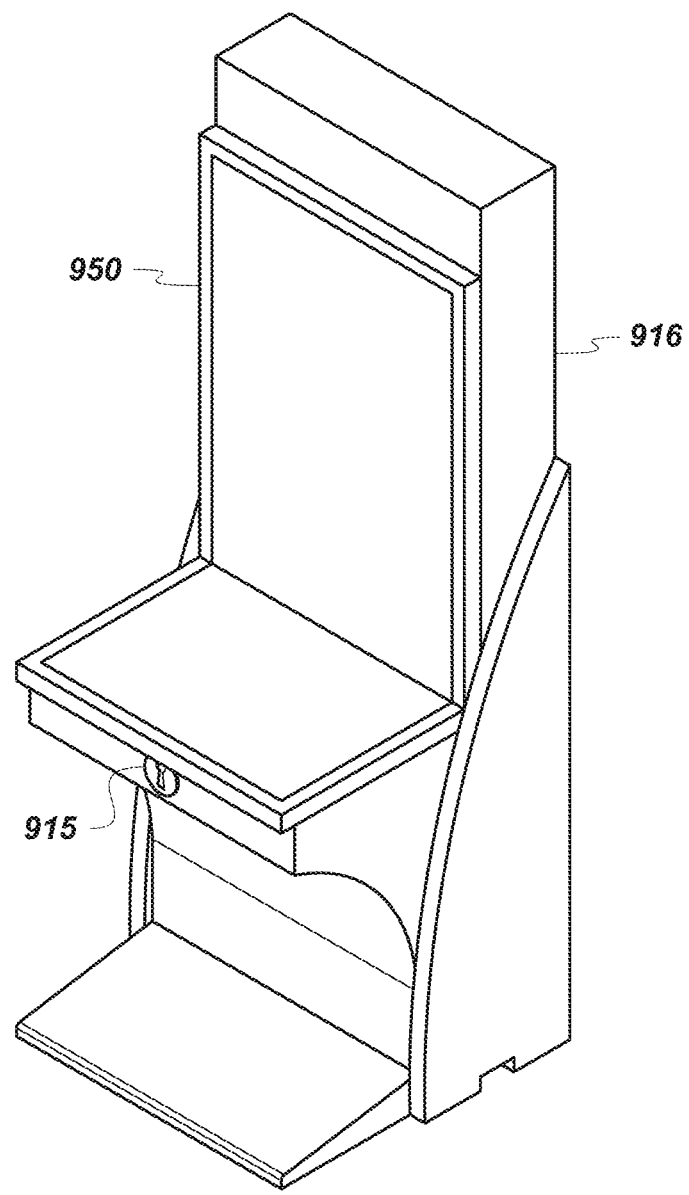
FIG. 9B depicts the example display assembly and the example main cabinet of FIG. 9A in an attached state.

The display assembly 350 may include a display panel 328, a housing for the display panel 328, and one or more mechanical and/or electrical components to couple with the main cabinet 316 (see, e.g., FIGS. 9A-9B). The display panel 328 may be a single display (e.g., an LCD or LED display) that includes a transition region 329 between a first planar display region 328A and a second planar display region 328B. As shown in FIG. 3B, the first planar display region 328A may be offset by an offset angle $\theta_1$ with respect to the second planar display region 328B. The housing for the display panel 328 may be referenced as a display assembly housing and may at least partially surround the display panel 328. A rear surface of the display assembly housing may include an electrical connector (see, e.g., first electrical connector 951 depicted in FIG. 9A) and/or multiple attachment mechanisms (e.g., the first and second side attachment mechanisms 953A/953B as depicted in FIG. 9A).

Moving back to FIG. 3A, the transition region 329 may define a boundary between the first planar display region 328A and the second planar display region 328B. In some cases, the transition region 329 remains as a part of the display panel 328 (e.g., the display panel 328 is bent at the transition region 329). In some cases, the transition region 329 is configured to display a black/white/colored bar (e.g., activated or un-activated pixels) with a thickness between 1-600 pixels, and/or between 100-200 pixels. In some cases, the transition region 329 has a width of 180 pixels. In some cases, the transition region 329 displays images, graphics, and/or illuminated pixels so as to emit light from the transition region 329. In some cases, only a portion of the transition region 329 (e.g., an outside portion) is illuminated so as to connect the first planar display region 328A with the second planar display region 328B.

As depicted in FIGS. 3A and 3B, the planar display regions may be facing different directions. For example, the first planar display region 328A is positioned substantially vertically, with respect to a ground surface, and the second planar display region 328B is positioned substantially horizontally, with respect to ground, such that an offset angle $\theta_1$ is set at 90°. In this way and continuing the above example, the second planar display region 328B and the first planar display region 328A are perpendicular with respect to each other.

Though an offset angle $\theta_1$ of 90° is discussed, any offset angle $\theta_1$ may be used in accordance with the provided disclosure. For example, an offset angle $\theta_1$ of 45°, 35°, 15°, 25°, and so on may be used in accordance with the provided disclosure.

The two planar display regions may display identical UIs (e.g., a duplicated UI), may display different UIs, or may display an extended UI (e.g., a UI which extends across the first planar display region 328A and the second planar display region 328B). In cases where the two planar display regions display different UIs, each UI may be provided for a different purpose. For example, the first planar display region 328A displays various animations related to, for example, a number of cards being drawn, a video pachinko game play animation, a video black jack dealer, a spinning roulette wheel, and so on. The second planar display region 328B displays menus, input options, and so on, configured to receive a player input. For example, the second planar display region 338B displays a keno card, a hand of cards associated with the player, options to select certain numbers/colors for a roulette wheel, and so on. In additional or alternative examples, the second planar display region 428B is a virtual button deck that presents and/or is connected to multiple bet buttons and one or more spin buttons. Though particular UIs are discussed with respect to particular planar display regions, it is noted that any UI may be provided on any planar display region in accordance with the design principles of any particular game.

In some cases, the second planar display region 328B is a touch-sensitive display and the first planar display region 328A is not configured to receive touch inputs. For example, an additional layer configured to detect touch and/or force inputs is created over the second planar display region 328B. This layer may be any single layer or any combination of multiple layers including, for example, a drive layer, a compliant layer, and a sensor layer. Any type of touch sensing, including resistive touch sensing, surface capacitive sensing, projected capacitance sensing, and so on, may be used. In alternative cases, both the first planar display region 328A and the second planar display region 328B are touch-sensitive or neither of the planar display regions are touch-sensitive.

In some cases, as depicted in FIGS. 3A and 3B, the first planar display region 328A are substantially perpendicular/vertical to a mounting surface of the gaming device 300 and/or are substantially perpendicular/vertical with respect to a viewing angle of a player of the gaming device 300. In addition, the second planar display region 328B may be substantially horizontal/perpendicular with respect to the first planar display region 328A. In some cases, the angle of any one of the first planar display region 328A and the second planar display region 328B is set to any value.

Any size or resolution of a display panel 328 may be used. In some examples, the display panel 328 is a 43-inch display with a 4k resolution (e.g., a horizontal resolution of about 4,000 pixels). In some cases, the planar display regions comprise the same resolution. For example, the first planar display region 328A has a resolution of 1920×1080 and the second planar display region 328B also has a resolution of 1920×1080, though these are merely examples and any resolution may be used. In some cases, the first planar display region 328A and the second planar display region 328B have different resolutions. In FIGS. 3A and 3B, the first planar display region 328A is approximately twice the size of the second planar display region 328B, though this is merely an example and any size of either planar display region may be used.

A display panel 328 may include any type of display including a liquid-crystal display (LCD), an organic light-emitting diode (OLED) display, a light-emitting diode (LED) display, and so on. In some cases, the display panel 328 may be configured to modify a brightness based on electrical signals modified by a controller.

Figure 4A:
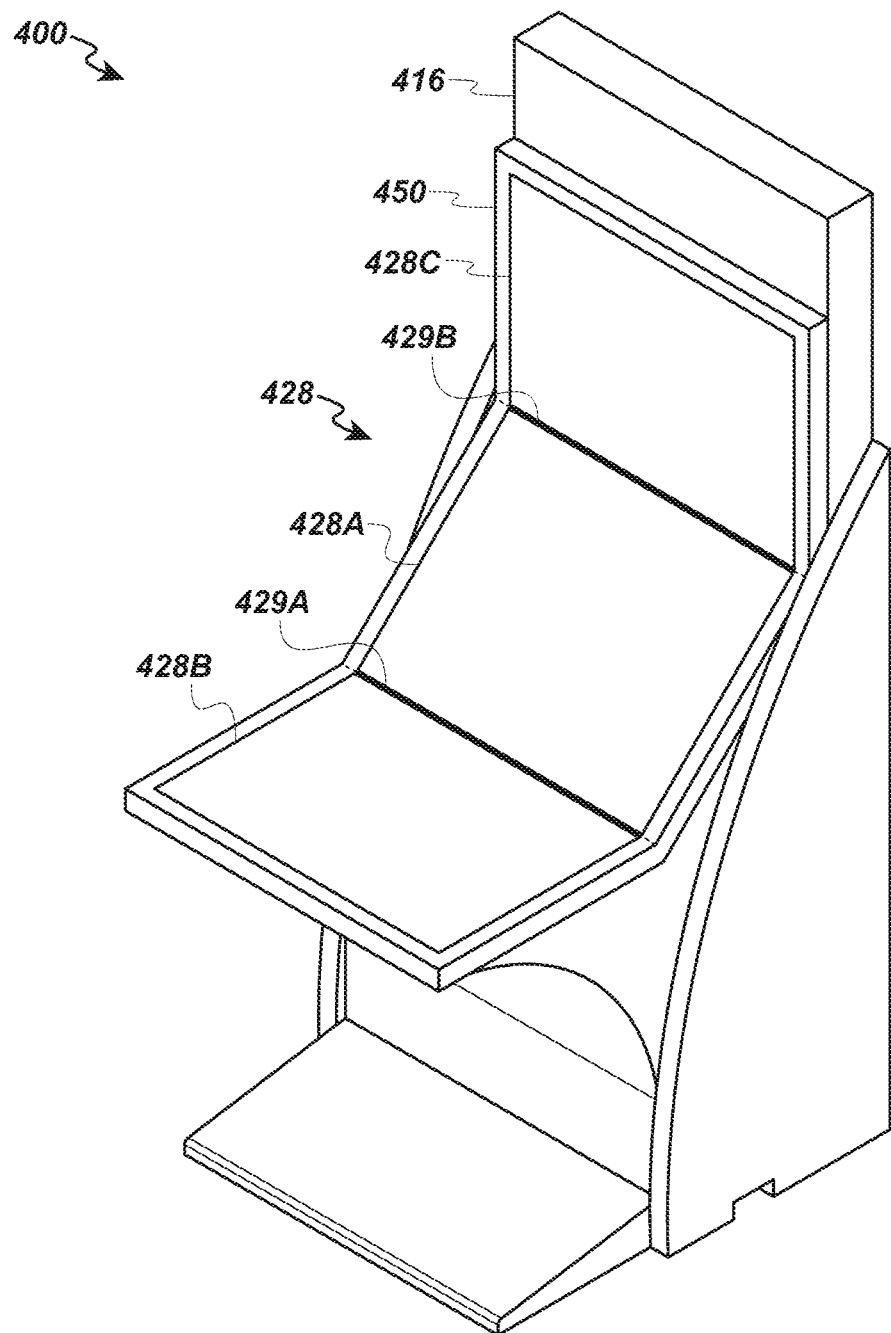
FIGS. 4A and 4B depict an example gaming device that includes a display panel with three planar display regions.

FIG. 4A illustrates an example gaming device 400 (e.g., an EGM) including a display panel 428 with a first planar display region 428A, a second planar display region 428B, and a third planar display region 428C. The gaming device 400 may be similar to the gaming device 300 described and depicted with reference to FIGS. 3A and 3B and duplicative descriptions may be omitted or reduced. Further, the gaming device 400 may be similar to the gaming devices discussed herein (e.g., gaming devices 104A-104X).

The gaming device 400 may include a main cabinet 416 coupled with a display assembly 450. The display assembly may include a display panel 428, a housing for the display panel 428, and one or more mechanical and/or electrical components to couple with the main cabinet 416. In some cases, the main cabinet 416 is substantially similar to the main cabinet 316. In alternate cases, the main cabinet 416 has a different form to account for the differently shaped display assembly 450. The main cabinet 416 may include all electronic/internal components as discussed herein such as, for example, a game controller.

Figure 4B:
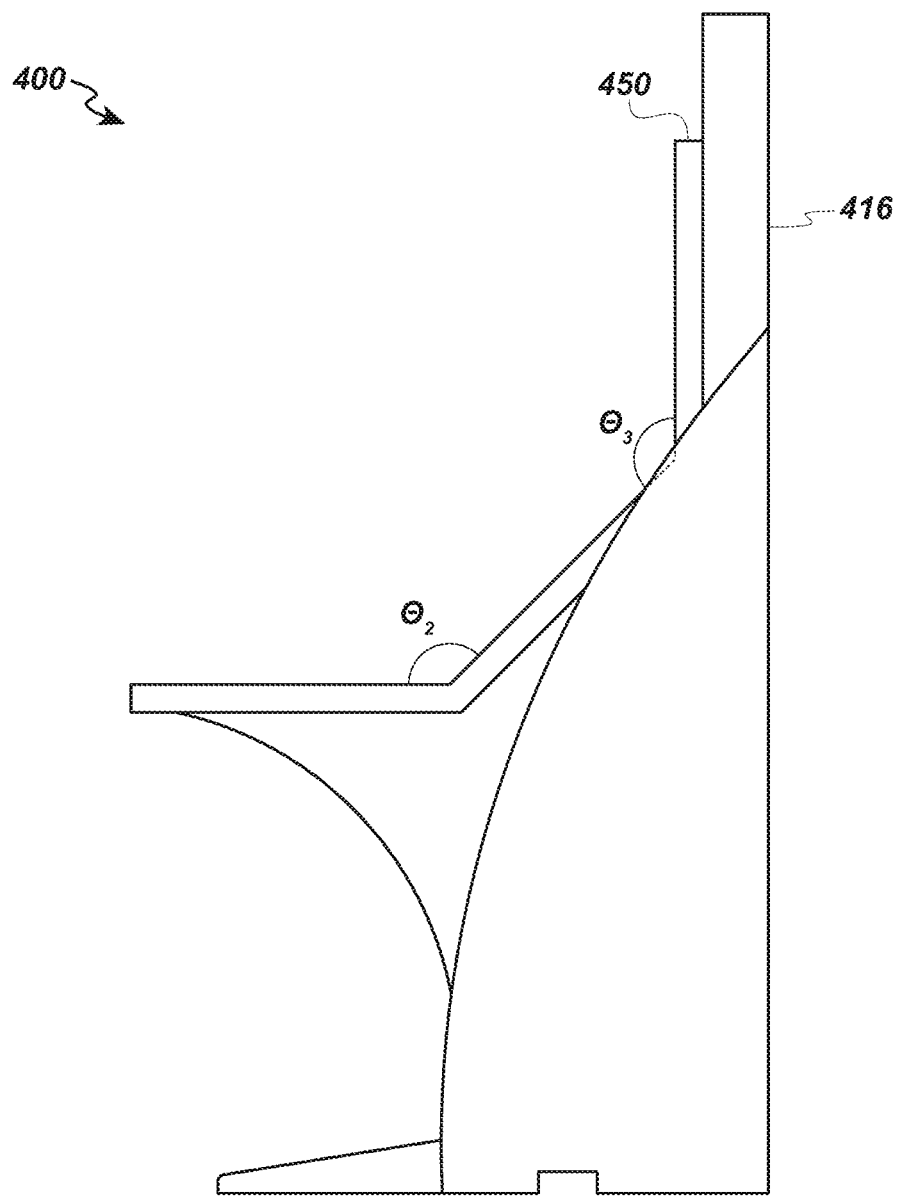

As depicted in FIG. 4B, each planar display region may be offset by a respective offset angle with respect to a neighboring planar display region. For example, a first planar display region 428A is offset from a second planar display region 428B by a first offset angle $\theta_2$. Similarly, the first planar display region 428A is offset from a third planar display region 428C by a second offset angle $\theta_3$. As depicted, the first offset angle $\theta_2$ is set to 135° and the second offset angle is set to 45°, though these values are merely provided for explanatory purposes. In some cases, the first offset angle $\theta_2$ and the second offset angle $\theta_3$ are equivalent (e.g., 45°) or are set to any value. This arrangement may simulate the presence of three discrete displays using only the display panel 428. In alternative cases, the offset angles may be set to different values. As described with respect to FIGS. 3A and 3B, the particular value of any respective offset angle is not limited to any particular embodiment.

In some cases, the third planar display region 428C acts as an informational UI and displays graphics and/or animations relating to, for example, the name of the game running on the gaming device 400 (see, e.g., FIG. 8), though it is noted that any UI may be provided on any of the planar display regions including, but not limited to, extended or duplicate displays. In some cases, the second planar display region 428B is horizontal, with respect to ground, and the third planar display region 428C is vertical with respect to ground, though these are merely examples.

Moving back to FIG. 4A, the gaming device 400 may additionally comprise a first transition region 429A and a second transition region 429B. As discussed above, the transition regions may correspond to a transition between neighboring planar display regions and may be bent at an offset angle. The bent transition regions may be substantially equivalent in width and/or length (e.g., 180 pixels wide) or may have different widths and/or lengths depending on a degree of a bend. As discussed above, the transition regions may comprise turned-off pixels (e.g., dark pixels), illuminated pixels, or any combination thereof. The first transition region 429A and the second transition region 429B may comprise sharp edges or may be rounded, as described with respect to FIGS. 3A and 3B.

With respect to FIGS. 3A-4B, the multiple planar display regions may be designed to be viewable by a single player at different angles. However, the provided disclosure is not limited to this arrangement. As discussed below in FIGS. 5A-6, multiple planar display regions may be provided and may be configured to display graphical elements to more than one player and/or associated persons. In some cases, a player is not be able to view every provided planar display region at one time and some planar display regions are hidden from the player. In such cases, multiple players and/or associated persons each view different planar display regions if viewing the gaming device from different vantage points. This may be beneficial in, for example, competitive games where two or more players are pitted against each other. Continuing the above example, each individual player is prevented from viewing some planar display regions to avoid obtaining a competitive advantage over another player.

Figure 5A:
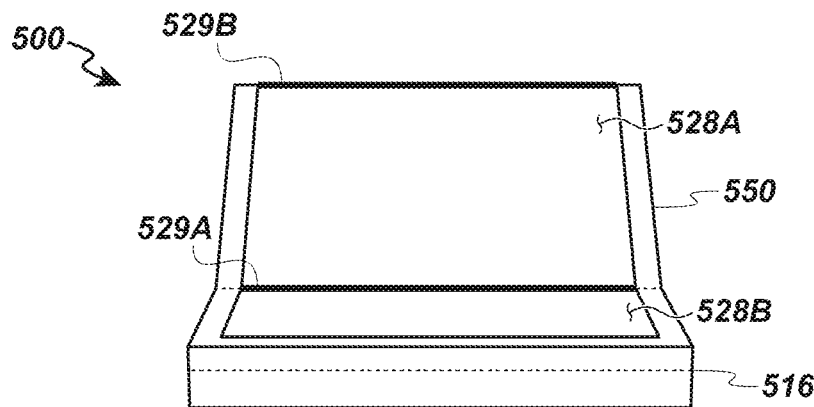
FIGS. 5A and 5B depict an alternative example of a gaming device with three planar display regions.
Figure 5B:
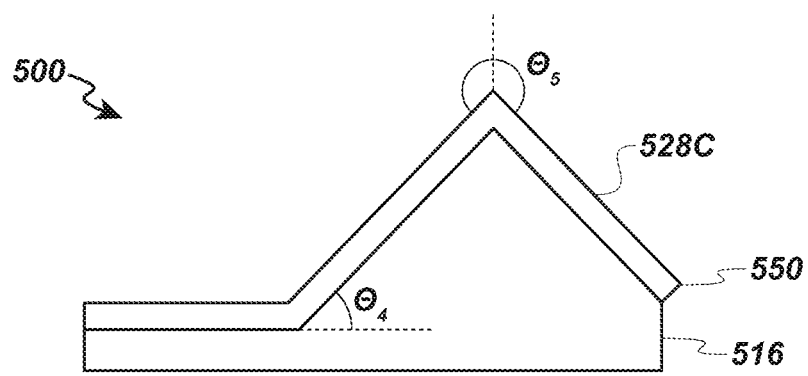

FIGS. 5A and 5B illustrate an example gaming device 500 (e.g., an EGM) that includes display regions viewable from different positions relative to the gaming device. As illustrated, the gaming device 500 includes planar display regions 528A, 528B, and 528C, with consecutive display regions separated by a respective transition region (e.g., a first transition region 529A and a second transition region 529B). The gaming device 500 may be configured so that two planar display regions (e.g., planar display regions 528A and 528B) face, or partially face, a first direction and another planar display region (e.g., planar display region 528C, see FIG. 5B) faces, or partially faces, an opposite direction. In this way, two planar display regions may face a player of the gaming device 500 and one planar display region may face an operator or attendant. For example, if the gaming device 500 were installed on a bar- or table-top, the two planar display regions 528A and 528B face a player and one planar display region 528C faces away from the player (so that an operator or attendant may, for example, navigate a menu). Similar to the examples discussed above with respect to FIGS. 3A-4B, the display panel 528 may comprise one uniform display and may comprise multiple planar display regions, each planar display region separated from a consecutive planar display region by a bent transition region. Likewise, the gaming device 500 may include a display assembly 550 and a game cabinet 516. In some cases, the gaming device is made smaller so as to fit on a table or bar. In some embodiments, the first planar display region 528A is offset from the second planar display region 528B by a 45° offset angle $\theta_4$, though $\theta_4$ may be set to any value. An offset angle $\theta_5$ may be set above 180°, such that the first planar display region 528A and the third planar display region 528C generally face opposite directions, though $\theta_5$ may be manufactured at any value.

Figure 6:
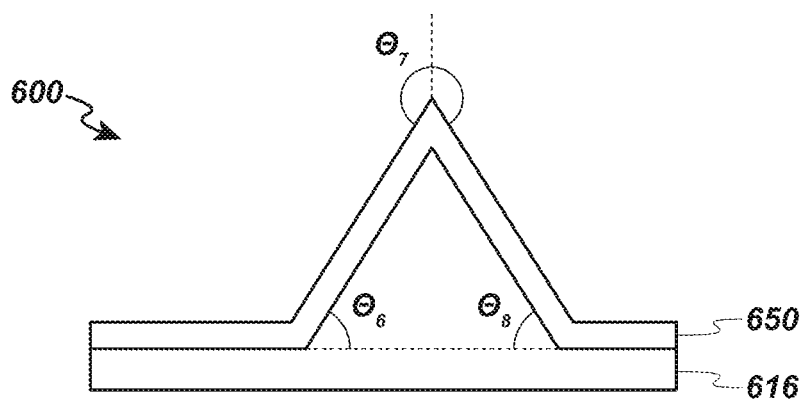
FIG. 6 depicts an example gaming device with four planar display regions.

FIG. 6 illustrates an example gaming device 600 (e.g., an EGM) that includes display regions viewable from different positions relative to the gaming device. The gaming device 600 may include a game cabinet 616, a display assembly 650, and a display panel that includes four planar display regions, as described herein. Two of the planar display regions may face one direction and the remaining two of the planar display regions may face an opposite direction. This may permit a head-to-head game where two players can each view two planar display regions without viewing the other planar display regions. As described above, the planar display regions may be offset by various offset angles $\theta_6$, $\theta_7$, and $\theta_8$, which may be set to any value such as, in the case of offset angles $\theta_6$ and $\theta_8$, 45° or, in the case of $\theta_7$, greater than 180°. Other features of gaming device 600 may be similar to those discussed with respect to FIGS. 1-5B.

Figure 7A:
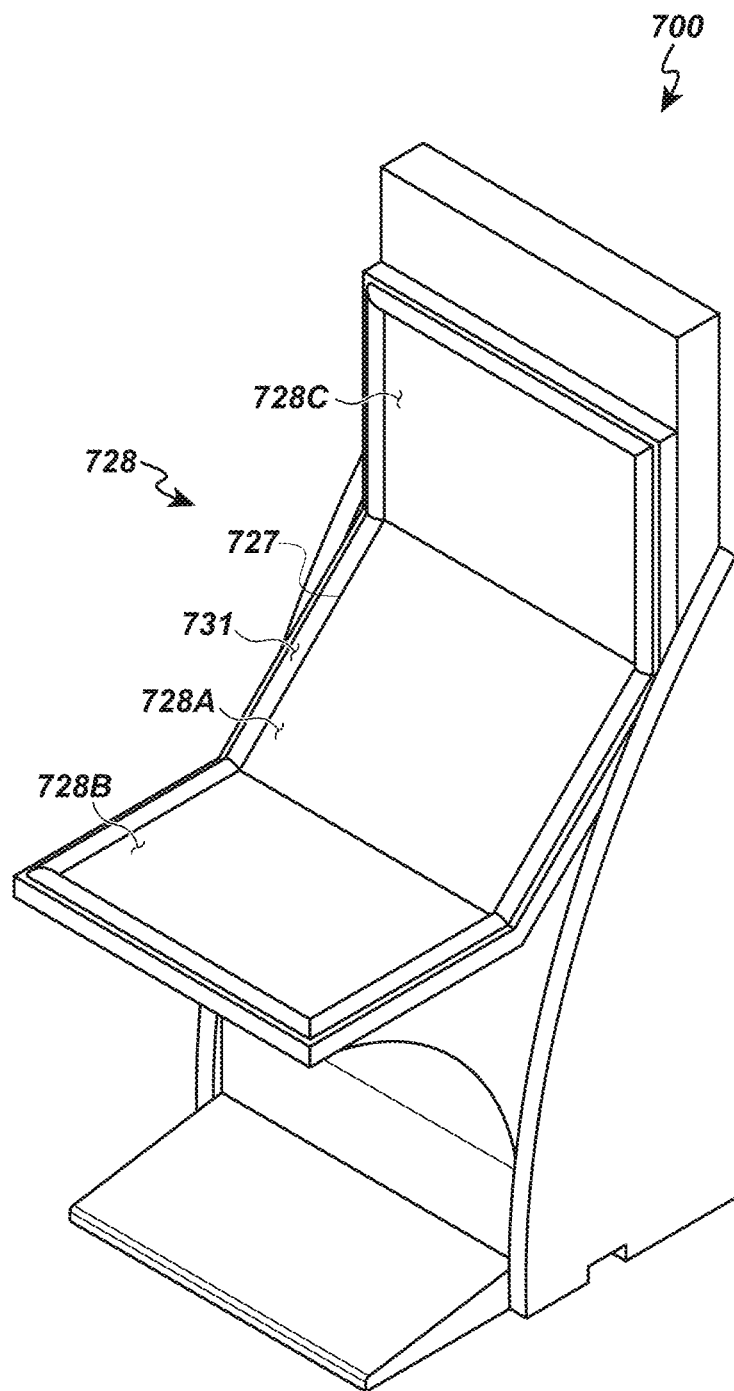
FIG. 7A depicts an example gaming device that includes a display panel with multiple planar display regions and a raised perimeter region.
Figure 7B:
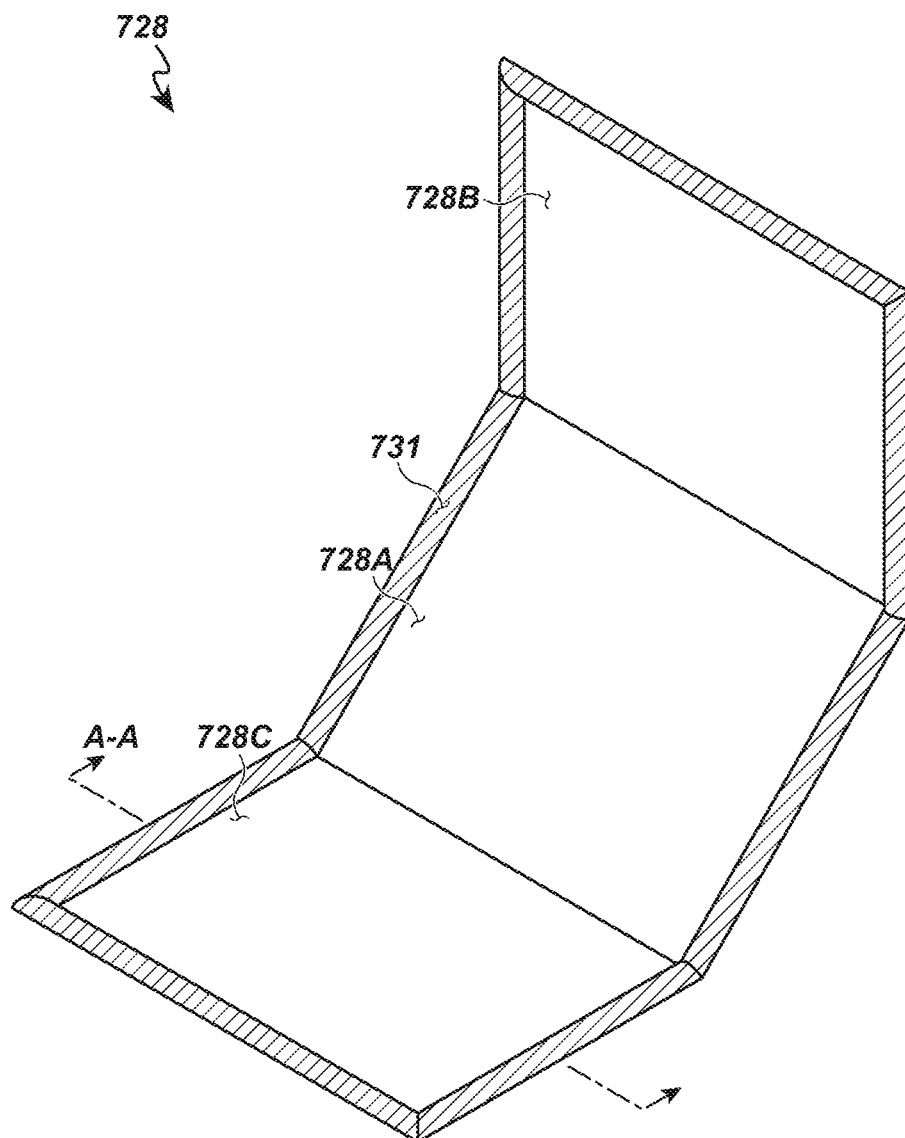
FIG. 7B depicts the display panel of FIG. 7A.
Figure 7C:
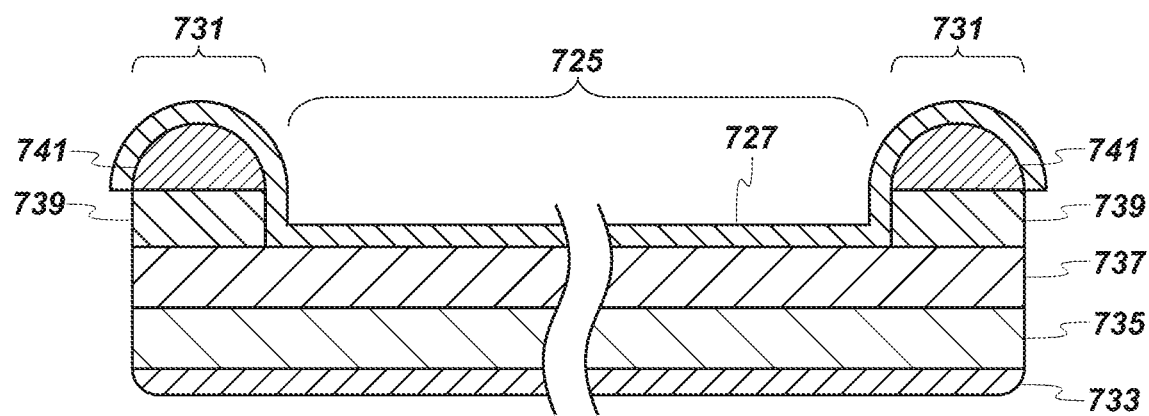
FIG. 7C depicts a cross-sectional view of the display panel shown in FIGS. 7A and 7B, taken through section line A-A of FIG. 7B.

FIGS. 7A-7C illustrate an example gaming device 700 including a display panel 728 and glass cover sheet 727 that defines a raised perimeter region 731. The gaming device 700 may be similar to the gaming devices discussed herein (e.g., gaming devices 104A-104X) and the visual appearance of the gaming device 700 is not limited to that depicted in FIG. 7A. Though FIG. 7A depicts three planar display regions, any number of planar display regions may be provided.

As depicted in FIG. 7A, the raised perimeter region 731 is raised compared to an interior region of the glass cover sheet 727 and surrounds a perimeter of the display panel 728. A height of the raised perimeter region 731 is not particularly limited and may be between 1 mm and 500 mm, be between 20 mm and 100 mm, and/or may be above 500 mm. As further depicted in FIG. 7A, each of the planar display regions 728A-728C may have a respective portion of their periphery surrounded by the raised perimeter region 731 such that the raised perimeter region 731 surrounds the interior region of the display panel 728. For example, the second planar display region 728B and the third planar display region 728C are surrounded on three sides by the raised perimeter region 731 and the first planar display region 728A are surrounded on two sides by the raised perimeter region 731.

As can be seen in FIG. 7C, the glass cover sheet 727 may have a substantially uniform thickness across a width of the glass cover sheet 727, but the raised perimeter region 731 may be raised relative to an interior region 725. The raised perimeter region 731 may allow various elements (e.g., a light pipe 739 and/or a gasket 741) to be disposed underneath the raised perimeter region 731, as discussed herein.

FIG. 7B illustrates a perspective view of a display with a raised perimeter region 731. As can be seen in FIG. 7B, the raised perimeter region 731 may surround the perimeter of the display panel 728. In alternative examples, a raised perimeter region surrounds each individual planar display region 728A-728C, though this is not depicted in FIG. 7A or 7B. The raised perimeter region 731 may act to keep liquid, or other objects, spilled on the glass cover sheet 727 contained within the glass cover sheet 727 so as to not damage electronic components as may be disposed on an associated main cabinet.

As depicted in FIG. 7C, the display assembly may include optical and/or other components beneath the raised perimeter region 731 of the glass cover sheet 727. The view in FIG. 7C is cut along line A-A as depicted in FIG. 7B. FIG. 7C illustrates a display assembly that includes a base layer 733, a backlight 735, a display 737, a light pipe 739, a gasket 741, and a glass cover sheet 727. The base layer 733 may be any layer acting as a casing/housing and may be formed of metal, plastic, glass, laminate, and so on. A backlight 735 may be coupled to the base layer 733 and may be configured to emit light toward the display 737. In some cases, and/or with certain types of display, the backlight 735 is omitted. The backlight 735 may be controlled (e.g., by a controller) to provide variable levels of display brightness which may be measured in lumens or nits. In some cases, the backlight 735 is non-uniform such that, for example, the raised perimeter region 731 is illuminated at a higher brightness than surrounding regions.

A display 737 may be any type of display including a liquid-crystal display (LCD), an organic light-emitting diode (OLED) display, a light-emitting diode (LED) display, and so on. In some cases, the display 737 is configured to modify a brightness, without the use of a backlight 735, based on electrical signals modified by a controller. As described herein, the display 737 may comprise multiple planar display regions separated by one or more bent transition regions.

A light pipe 739 may further be coupled on the display 737 at a perimeter surrounding the display. The light pipe 739 may include any optical elements configured to diffuse or otherwise manipulate light and may be transparent, or partially transparent. The light pipe 739 may diffuse, or blur, light emitted from the display 737 and/or backlight 735 which may result in providing a smoothed or blurred graphical output to a player. In this way, the portion of the display 737 beneath the raised perimeter region 731 may be perceived differently than a region of the display 737 beneath the interior region 725. A gasket 741 may further be positioned on top of the light pipe 739. The gasket 741 may be formed of a rubber, plastic, or other material and may be configured to protect the edge of a glass cover sheet 727 from impacts and/or breaks. The gasket 741 may be, for example, a circular gasket and may surround the perimeter of the display stack-up.

As described herein, a glass cover sheet 727 may be positioned on top of the gasket 741 (e.g., within the raised perimeter region 731) and/or on top of the display 737 (e.g., outside of the raised perimeter region 731). The glass cover sheet 727 may be any transparent, or partially transparent, material (including, but not limited to, glass) and may protect the display 737 from impacts and/or damage. The raised perimeter region 731 may be configured to strengthen the glass cover sheet 727 and may absorb, or otherwise mitigate, any potential damage from careless players or other environmental factors.

Figure 8:
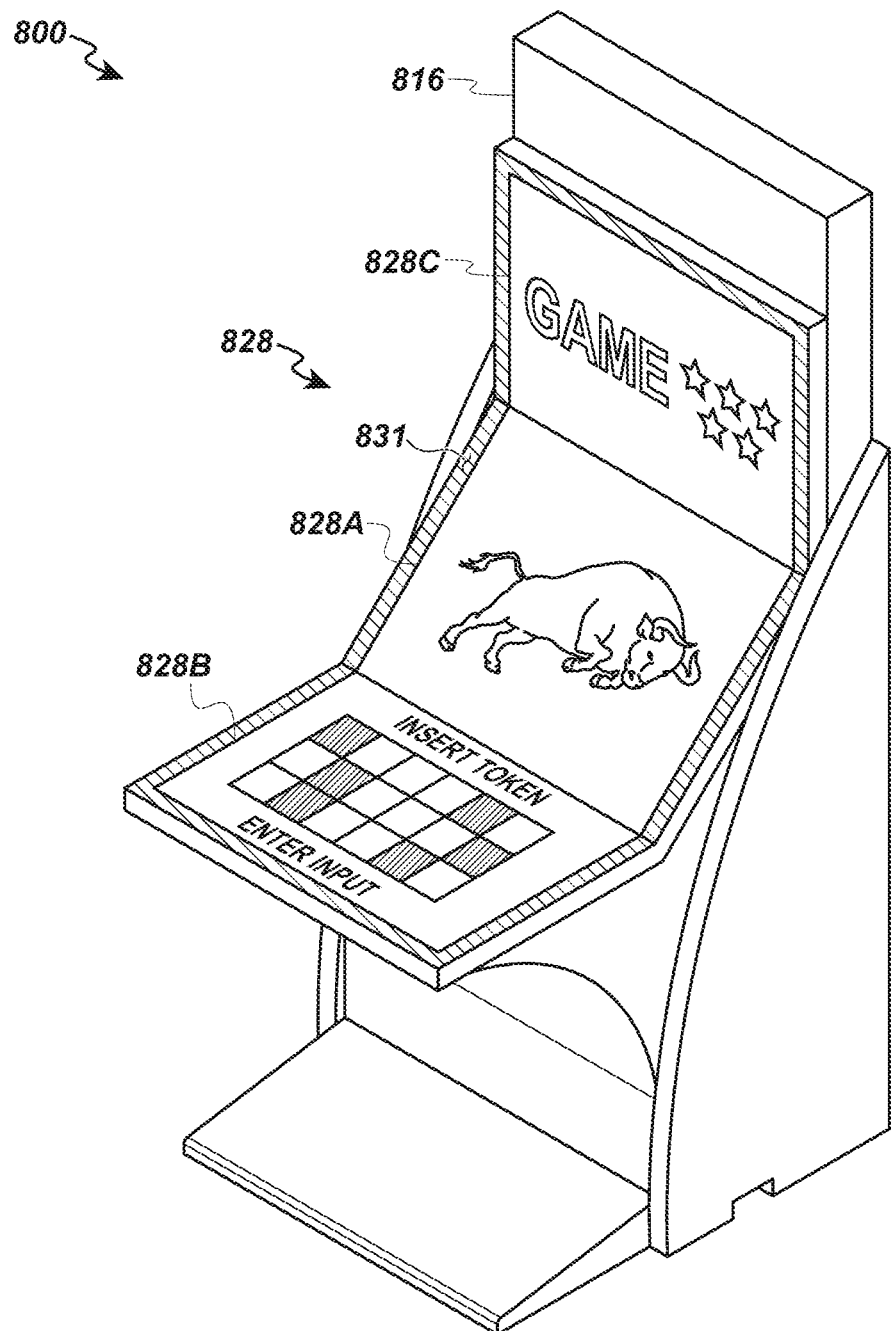
FIG. 8 depicts an example gaming device depicting an example user interface (UI) that includes gameplay elements and edge lighting elements.

FIG. 8 illustrates an example gaming device 800 including edge lighting and display outputs. A main cabinet 816 may be substantially similar to main cabinets described herein. As described with respect to FIGS. 7A-7C, a raised perimeter region 831 may be provided to surround a perimeter of a display panel 828. During the course of gameplay, certain game elements may be provided on the display panel 828, as controlled by a game controller. For example, a game board may be provided on a second planar display region 828B, a graphic may be provided on a first planar display region 828A, and a title or game advertisement may be provided on a third planar display region 828C. Continuing the above example, edge lighting may surround each of the display regions to emphasize certain areas or to draw a player's attention to the gaming device. As the edge lighting (corresponding to the raised perimeter region 831) is lit from a common display, the game controller may treat an edge portion differently to display specialized colors, graphics, and/or animations. The displayed portions corresponding to the raised perimeter region 831 may further be blurred or smoothed by, for example, a light pipe to further visually distinguish the edge region. In some cases, the raised perimeter region may correspond to a 100-pixel width of the display, though any width of the raised perimeter region may be used.

As the edge lighting is emitted by a common display (e.g., display panel 828) and is controlled by a controller, the need for separate LEDs and/or LED strips to produce an edge lighting effect may be eliminated. In this way, the game controller may control the portion of the display panel 828 that is directly underneath the raised perimeter region 831 differently than the portions of the display panel 828 that are internal with respect to the raised perimeter region 831.

FIGS. 9A and 9B depict an example display assembly 950 and an example main cabinet 916 comprising an electrical connector (e.g., a first electrical connector and a second electrical connector) and an attachment mechanism (e.g., a first attachment mechanism and a second attachment mechanism). The display assembly 950 depicted in FIG. 9A is detached from the main cabinet 916 and FIG. 9B depicts the display assembly 950 and the main cabinet 916 in an attached state.

With respect to FIG. 9A, a display assembly 950 may include a first electrical connector 951, a first attachment mechanism 949, a first side attachment mechanism 953A, and a second side attachment mechanism 953B. As used herein, the first and second side attachment mechanisms 953A and 953B may include paddles for connecting with the main cabinet 916. The display assembly 950 may interface, as discussed herein, with various locations on a main cabinet 916. The main cabinet 916 may include a second electrical connector 917, a second attachment mechanism 913, a first side cabinet attachment mechanism 919A, a second side cabinet attachment mechanism 919B, and a locking mechanism 915. The first side cabinet attachment mechanism 919A and the second side cabinet attachment mechanism 919B may comprise receiving elements that receive the first side attachment mechanism 953A and the second side attachment mechanism 953B.

The two electrical connectors (e.g., electrical connectors 951 and 917) may act as a pressure-based electrical contact system and may serve to electrically couple the display assembly 950 with the main cabinet 916. In an example, a first electrical connector 951 disposed on the display assembly 950 is electrically coupled to the display and various electronic components positioned within the display assembly 950 (e.g., speakers and/or input devices). The first electrical connector 951 may include various spring-loaded pins each comprising, for example, a plunger, a barrel, and a spring. When the display assembly 950 is uncoupled from the main cabinet 916, the first electrical connector 951 may have spring-loaded pins in an extended position as the spring, in an un-compressed state, extending the barrel outward. When the display assembly 950 is integrated with the main cabinet 916 (e.g., installed), the spring may be compressed by, for example, a normal force with the main cabinet 916.

The first electrical connector 951 may be formed as a grid, or series of regions, each corresponding to a particular electronic engagement. In an example, the first electrical connector 951 includes engagements for multiple power connections (e.g., 5 volts, 12 volts, 24 volts, and ground), video in-or-out connections (e.g., a display connection, a digital visual interface (DVI) connection, a high-definition multimedia interface (HDMI) connection), a universal serial bus (USB) connection, an audio connection (e.g., digital or analog), and so on. In some cases, each particular engagement (e.g., an HDMI engagement) comprises multiple regions, or pins, from the first electrical connector 951.

The second electrical connector 917 formed on the main cabinet 916 may include respective electronic engagements that correspond with the engagements on the first electrical connector 951. In some examples, the first electrical connector 951 includes spring-loaded pins and the second electrical connector 917 includes a receiver configured to receive each spring-loaded pin (e.g., electrically-sensitive regions), though, in some cases, this arrangement may be reversed (e.g., the second electrical connector 917 may comprise spring-loaded pins). In some cases, compressing the spring loaded pins from a contact with the second electrical connector 917 closes a circuit and results in electricity flowing through the first electrical connector 951 and the second electrical connector 917. Though spring-loaded pins are discussed with respect to the electrical connectors, any pressure contact system for electrically coupling the display assembly 950 with the main cabinet 916 may be used.

In addition to the electrical connector (e.g., connectors 917 and 951), various mechanical connectors may connect the main cabinet 916 with the display assembly 950. For example, the display assembly 950 includes a first attachment mechanism 949 and the main cabinet 916 includes a second attachment mechanism 913. As depicted in FIG. 9A, the first attachment mechanism 949 is positioned on an external surface of the display assembly 950, the external surface opposite from a surface defined by a glass cover sheet.

The first attachment mechanism 949 may be configured as a slot or port to receive a counterpart second attachment mechanism 913. The first attachment mechanisms 949 may include springs or other biasing components configured to press against the second attachment mechanism 913 and may be attached, via internal cables, to one or both of a first side attachment mechanism 953A or a second side attachment mechanism 953B.

In an installed state, as depicted in FIG. 9B, the display assembly 950 is attached with the main cabinet 916. While in the installed state, the first side attachment mechanism 953A may be coupled with the first side cabinet attachment mechanism 919A, the second side attachment mechanism 953B may be coupled with the second side cabinet attachment mechanism 919B, and the first attachment mechanism 949 may be coupled with the second attachment mechanism 913. As depicted in FIG. 9B, the second attachment mechanism 913 is coupled to a locking mechanism 915 and transitions between two different states depending on whether the locking mechanism 915 is locked or unlocked. When locked, the display assembly 950 and the main cabinet 916 are securely fastened together such that removal of the display assembly 950 from the main cabinet 916 is prevented.

When the locking mechanism 915 is unlocked (e.g., by an operator), the second attachment mechanism 913 transitions to an unlocked state (e.g., by swiveling around a rotation axis) and becomes decoupled with the first attachment mechanism 949. As described above, the first attachment mechanism 949 may include a biasing mechanism at an internal portion thereof and the biasing mechanism may apply a force to separate the display assembly 950 from the main cabinet 916.

As the locking mechanism 915 is unlocked, cables linked with the first side cabinet attachment mechanism 919A and the second side cabinet attachment mechanism 919B may loosen, rotate, or cause rotation in any or both of the paddles, or may otherwise change a state to decouple with the respective paddles on the display assembly 950 (e.g., paddles 953A and 953B). In some cases, the locking mechanism 915 only controls the first attachment mechanism 949 and the second attachment mechanism 913 without affecting the paddle mechanisms. Thereafter, when an operator grips the display assembly 950, the display assembly may be easily removable from the main cabinet 916. This may allow for quick replacement of any particular display assembly 950. Any number of brackets or structures (e.g., a rear wedge bracket) may be provided to ensure a connection between the display assembly 950 and the main cabinet 916.

The paddles and/or attachment mechanisms may also include various physical features (e.g., chamfers, slopes, planes, protrusions, wedges, and so on) to assist in the alignment between the display assembly 950 and the main cabinet 916. In some cases, a tactile and/or audible feedback (e.g., a snap sound or feeling) occurs when the display assembly 950 is properly installed with the main cabinet 916. In some cases, the display assembly 950 and the main cabinet 916 are only installed when the locking mechanism 915 is in an unlocked position and are "locked" into place when the locking mechanism 915 transitions to a locked position.

While the disclosure has been described with respect to the figures, it will be appreciated that many modifications and changes may be made by those skilled in the art without departing from the spirit of the disclosure. Any variation and derivation from the above description and figures are included in the scope of the present disclosure as defined by the claims. As used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not indicate that the described example is preferred or better than other examples.

What is claimed is:

1. A gaming device comprising:
    a main cabinet;
    a game controller positioned in the main cabinet and configured to control a game provided at the gaming device; and
    a display assembly coupled to the main cabinet and comprising:
        a display panel configured to provide graphical outputs corresponding to the game;
        a glass cover sheet extending over the display panel and defining:
            an interior region disposed above the display panel; and
            a raised perimeter region disposed above a perimeter region of the display panel and configured to receive light from the display panel, the raised perimeter region at least partially surrounding the interior region and raised relative to the interior region; and
        a light pipe disposed underneath the raised perimeter region, the light pipe configured to diffuse light within the raised perimeter region.

2. The gaming device of claim 1, wherein the game controller is configured to drive the perimeter region of the display panel separately from remaining portions of the display panel to selectively illuminate the raised perimeter region of the glass cover sheet.

3. The gaming device of claim 1, wherein the display assembly further comprises:
    a gasket positioned between the light pipe and the glass cover sheet.

4. The gaming device of claim 1, wherein the display panel defines:
    a first planar display region; and
    a second planar display region offset from the first planar display region by an offset angle.

5. The gaming device of claim 4, wherein:
    the offset angle is a first offset angle;
    the display assembly further defines a third planar display region offset from the first planar display region by a second offset angle; and
    the first planar display region is substantially perpendicular with respect to a mounting surface of the main cabinet.

6. The gaming device of claim 1, wherein the display assembly further comprises:
    a base layer;
    a backlight positioned on the base layer;
    a light pipe positioned on the display panel; and
    a gasket positioned between the light pipe and the glass cover sheet.

7. The gaming device of claim 1, wherein the graphical outputs provided by the display panel comprise:
    a first graphical output provided to the perimeter region of the display panel, the first graphical output underneath the raised perimeter region of the glass cover sheet; and
    a second graphical output provided to a remaining portion of the display panel, the second graphical output underneath the interior region of the glass cover sheet.

8. The gaming device of claim 1, wherein the display assembly further comprises a touch sensor configured to detect an input force applied to the glass cover sheet.

9. A gaming device comprising:
    a housing;
    a display assembly comprising a display panel;
    a glass cover sheet extending over the display panel and defining a raised perimeter region positioned at least partially over the display panel and surrounding an internal region of the glass cover sheet;
    a display assembly housing at least partially surrounding the display panel;
    a light pipe disposed underneath the raised perimeter region, the light pipe configured to diffuse light from the display panel within the raised perimeter region; and
    a gasket positioned between the light pipe and the glass cover sheet.

10. The gaming device of claim 9, wherein the display panel defines:
    a first planar display region;
    a second planar display region offset from the first planar display region by a first offset angle; and
    a third planar display region offset from the first planar display region by a second offset angle.

11. The gaming device of claim 10, wherein each of the first planar display region, the second planar display region, and the third planar display region are at least partially defined by the raised perimeter region of the glass cover sheet.

12. The gaming device of claim 10, further comprising:
    a lock; and
    a biasing element configured to provide a force to separate the display assembly from the housing when the lock is in an unlocked position.

13. The gaming device of claim 9, wherein the raised perimeter region reinforces the glass cover sheet against impact forces.

14. The gaming device of claim 9, further comprising a game controller positioned within the housing, wherein the game controller is configured to:
  cause the display panel to produce a first graphical output corresponding to the raised perimeter region; and
  cause the display panel to produce a second graphical output corresponding to an interior region.

15. The gaming device of claim 14, wherein:
  the first graphical output corresponds to edge lighting; and
  the second graphical output corresponds to a game controlled by the game controller.

16. A display assembly configured to be coupled with a main cabinet of a gaming device, the display assembly comprising:
  a display panel configured to provide graphical outputs;
  a cover sheet extending over the display panel and defining a raised perimeter region disposed above a perimeter region of the display panel; and
  a light pipe disposed underneath the raised perimeter region, the light pipe configured to diffuse light from the display panel within the raised perimeter region.

17. The display assembly of claim 16, wherein the display panel defines:
  a first planar display region configured to provide a first graphical output; and
  a second planar display region configured to provide a second graphical output, the second planar display region offset from the first planar display region by an offset angle.

18. The display assembly of claim 16, wherein the cover sheet is a glass cover sheet.

19. The display assembly of claim 17, wherein the first graphical output is separately controllable from the second graphical output.

20. The display assembly of claim 16, further comprising a gasket positioned between the light pipe and the cover sheet.

* * * * *